(12) United States Patent
Kim et al.

(10) Patent No.: US 8,570,264 B2
(45) Date of Patent: Oct. 29, 2013

(54) LIQUID CRYSTAL DISPLAY APPARATUS WITH WIDE VIEWING ANGLE

(75) Inventors: Dong-Gyu Kim, Yongin-si (KR); Sang-Soo Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 1002 days.

(21) Appl. No.: 11/351,728

(22) Filed: Feb. 10, 2006

(65) Prior Publication Data

US 2006/0180813 A1 Aug. 17, 2006

(30) Foreign Application Priority Data

Feb. 11, 2005 (KR) .................. 10-2005-0011671

(51) Int. Cl.
*G09G 3/36* (2006.01)

(52) U.S. Cl.
USPC .......................................................... 345/90

(58) Field of Classification Search
USPC ..................... 345/87–100; 349/39, 143–147
See application file for complete search history.

(56) References Cited

U.S. PATENT DOCUMENTS

| | | | | |
|---|---|---|---|---|
| 5,568,163 A * | 10/1996 | Okumura | ...................... | 345/100 |
| 5,576,858 A | 11/1996 | Ukai et al. | | |
| 5,610,739 A * | 3/1997 | Uno et al. | ......................... | 349/39 |
| 5,940,057 A * | 8/1999 | Lien et al. | ......................... | 345/89 |
| 6,028,577 A * | 2/2000 | Sakamoto | ......................... | 345/92 |
| 6,028,581 A | 2/2000 | Umeya | | |
| 6,104,450 A | 8/2000 | Hiraishi | | |
| 6,344,889 B1 * | 2/2002 | Hasegawa et al. | ............. | 349/129 |
| 6,445,372 B1 * | 9/2002 | Asai | ................................ | 345/99 |
| 6,587,161 B1 * | 7/2003 | Yamamoto et al. | ............. | 349/43 |
| 7,109,958 B1 * | 9/2006 | Martin | ............................ | 345/87 |
| 2001/0046003 A1 * | 11/2001 | Song | ............................ | 349/43 |
| 2002/0047822 A1 * | 4/2002 | Senda et al. | .................... | 345/90 |
| 2003/0071952 A1 * | 4/2003 | Yoshida et al. | ................ | 349/141 |
| 2004/0070713 A1 * | 4/2004 | Song | ............................. | 349/129 |
| 2004/0263760 A1 * | 12/2004 | Kodate et al. | .................. | 349/151 |
| 2005/0036091 A1 * | 2/2005 | Song | ............................. | 349/129 |
| 2005/0179631 A1 * | 8/2005 | Lyu | ................................. | 345/87 |
| 2005/0253797 A1 * | 11/2005 | Kamada et al. | ................. | 345/89 |
| 2006/0176264 A1 * | 8/2006 | Go | ................................ | 345/100 |
| 2006/0208984 A1 * | 9/2006 | Kim et al. | ........................ | 345/90 |

FOREIGN PATENT DOCUMENTS

| | | |
|---|---|---|
| CN | 1495476 | 5/2004 |
| CN | 1573486 | 2/2005 |
| JP | 08-160455 | 6/1996 |
| JP | 08-201777 | 8/1996 |
| JP | 08-211407 A | 8/1996 |
| JP | 09-043609 | 2/1997 |
| JP | 09-054341 | 2/1997 |
| JP | 09-189922 A | 7/1997 |
| JP | 09269509 A | 10/1997 |
| JP | 10-068931 | 3/1998 |

(Continued)

*Primary Examiner* — Chanh Nguyen
*Assistant Examiner* — Robert Stone
(74) *Attorney, Agent, or Firm* — Innovation Counsel LLP

(57) ABSTRACT

A liquid crystal display with an improved reference viewing angle is presented. A pixel electrode includes first and second sub-pixel electrodes. A first switching device is connected to the first sub-pixel electrode, one of gate lines, and one of the data lines. A voltage of the second sub-pixel electrode relative to a predetermined voltage is lower than a voltage of the first sub-pixel electrode relative to the predetermined voltage, and an area of the first sub-pixel electrode is smaller than that of the second sub-pixel electrode.

22 Claims, 15 Drawing Sheets

(56) References Cited

FOREIGN PATENT DOCUMENTS

| | | |
|---|---|---|
| JP | 2000-333918 A | 12/2000 |
| JP | 2001-109018 | 4/2001 |
| JP | 2001-222027 | 8/2001 |
| JP | 2002-333870 | 11/2002 |
| JP | 2003-186451 | 7/2003 |
| JP | 2004-145266 | 5/2004 |
| JP | 2004-213011 | 7/2004 |
| JP | 2004-258598 | 9/2004 |
| JP | 2004-279904 A | 10/2004 |
| KR | 19970005638 B | 4/1997 |
| KR | 1020010106849 A | 12/2001 |
| KR | 1020020066977 A | 8/2002 |
| KR | 1020030008044 | 1/2003 |
| KR | 1020030065817 | 8/2003 |
| KR | 1020040001687 A | 1/2004 |
| KR | 1020040002600 | 1/2004 |
| KR | 1020040020318 | 3/2004 |
| KR | 1020040062752 | 7/2004 |
| KR | 1020040086761 | 10/2004 |
| TW | 200407645 | 5/2004 |

\* cited by examiner

LIQUID CRYSTAL DISPLAY APPARATUS WITH WIDE VIEWING ANGLE

CROSS-REFERENCE TO RELATED PATENT APPLICATION

This application claims the benefit of Korean Patent Application No. 10-2005-0011671 filed on Feb. 11, 2005 in the Korean Intellectual Property Office, and the content of the Korean Patent Application is herein incorporated by reference in its entirety.

BACKGROUND OF THE INVENTION (a) Field of the Invention

The present invention relates generally to a liquid crystal display and more particularly to a liquid crystal display operating in vertical alignment mode.

(b) Description of the Related Art

Liquid crystal displays are one of the most widely used types of flat panel display apparatuses today. A liquid crystal display typically includes two panels having electric field generating electrodes such as pixel electrodes and a common electrode, and a liquid crystal layer interposed between the two panels. The liquid crystal display displays an image by applying a voltage to the electric field generating electrodes to generate an electric field in the liquid crystal layer. The electric field determines the alignment of liquid crystal molecules in the liquid crystal layer and controls the polarization of incident light.

Among the different types of liquid crystal displays, a liquid crystal display with a vertical alignment mode has attracted much attention recently for its high contrast ratio and wide reference viewing angle. In the vertical alignment mode, liquid crystal molecules are arranged such that major axes of the liquid crystal molecules are perpendicular to the upper and lower panels when no electric field is generated. As used herein, the "reference viewing angle" denotes a viewing angle corresponding to a contrast ratio of 1:10 or a limited angle for brightness inversion between grayscales.

To widen the reference viewing angle in the liquid crystal display with a vertical alignment mode, cutouts may be formed in the electric field-generating electrodes. Also, protrusions may be formed on the electric field-generating electrodes to widen the reference viewing angle. Since the cutouts and the protrusions can be used to control the tilt directions of liquid crystal molecules, the liquid crystal molecules can be tilted in the desired directions by using the cutouts and the protrusions. This way, the wide viewing angle can be secured.

Although the liquid crystal display with a vertical alignment mode provides a wide viewing angle, there is a problem in that its side visibility is inferior in comparison to its visibility from the front. For example, in a pattern of a vertically-aligned type of liquid crystal display provided with cutouts, images in the side portions of the liquid crystal display become brighter. In more severe cases, the brightness difference between high grayscales disappears, causing a distortion of the image.

Various techniques have been proposed to solve the problems, including a technique for providing different transmittances by dividing one pixel into two sub-pixels, coupling the two sub-pixels in a capacitive manner, and providing different voltages to the two sub-pixels by directly applying a voltage to the one sub-pixel and reducing the voltage in the other sub-pixel due to capacitive coupling.

However, the above techniques are less effective in practice than in theory because the transmittances of the two sub-pixels cannot be accurately adjusted. In particular, since the transmittances of different colors of light are different from each other, different voltage combinations must be provided for different colors. However, providing of different voltage combinations to different-colored pixels cannot be implemented. An additional problem with these techniques is that, since conductive members for the capacitive coupling must be added, the aperture ratio deteriorates. Also, the transmittance decreases due to a voltage drop caused by the capacitive coupling.

A liquid crystal display that can be operated in the vertical alignment mode with a wide reference viewing angle without the above disadvantages is desired.

SUMMARY OF THE INVENTION

The present invention provides a liquid crystal display that is capable of solving the aforementioned problems.

In one aspect, the invention is a liquid crystal display that includes: a pixel electrode including first and second sub-pixel electrodes; a first switching device connected to the first sub-pixel electrode; a plurality of gate lines, with a first one of the gate lines connected to the first switching device; and a plurality of data lines intersecting the gate lines and transmitting data voltages, with one of the data lines connected to the first switching device. A voltage of the second sub-pixel electrode relative to a predetermined voltage is lower than a voltage of the first sub-pixel electrode relative to the predetermined voltage, and an area of the first sub-pixel electrode is smaller than an area of the second sub-pixel electrode.

The liquid crystal display may further include a second switching device connected to the second sub-pixel electrode, one of the gate lines, and one of the data lines, wherein the voltages applied to the first and second sub-pixel electrodes are different from each other and are obtained from single image information, and wherein the first sub-pixel electrode and the second sub-pixel electrode simultaneously start to be supplied with a data voltage or the first sub-pixel electrode starts to be supplied with a data voltage after the second sub-pixel electrode starts to be supplied with the data voltage.

The first and second sub-pixel electrodes are simultaneously supplied with a data voltage for a predetermined time period.

In addition, a time period from an end of the application of a gate-on voltage to the second signal line to an end of the application of a data voltage to the second sub-pixel electrode and a time period from an end of the application of the gate-on voltage to the first signal line to an end of the application of a data voltage to the second sub-pixel electrode are longer than a time period from a start of the application of a data voltage to a start of the application of the gate-on voltage to the second signal line.

Further, a time duration of the gate-on voltage being applied to the first signal line may be longer than a time duration of the gate-on voltage being applied to the second signal line.

The first sub-pixel electrode may be surrounded by the second sub-pixel electrode.

In addition, the gate lines may include a first signal line connected to the first switching device and a second signal line connected to the second switching device, wherein the second signal line overlaps the pixel electrode.

The liquid crystal display may further include a storage electrode overlapping the pixel electrode.

The gate lines may include a first signal line connected to the first switching device and a second signal line connected to the second switching device, wherein the first signal line is disposed at a boundary of the pixel electrodes, and the second signal line is disposed between the first signal line and the storage electrode.

The first signal line may overlap the pixel electrode, and the width of the first signal line may be less than the width of the second signal line.

In another aspect, the invention is a liquid crystal display that includes: a pixel including first and second liquid crystal capacitors and first and second switching elements, wherein the first liquid crystal capacitor comprises a first liquid crystal portion disposed between a common electrode and a first sub-pixel electrode, and the second liquid crystal capacitor comprises a second liquid crystal portion disposed between the common electrode and a second sub-pixel electrode, wherein the first switching element is connected to a first gate line, a data line and the first sub-pixel electrode, and the second switching element is connected to a second gate line, the data line and the second sub-pixel electrode, wherein a first pixel voltage applied to the first liquid crystal portion is larger than a second pixel voltage applied to the second liquid crystal portion when the first switching element and the second switching element are in an off state, and wherein an area of the first sub-pixel electrode is smaller than an area of the second sub-pixel electrode.

The first pixel voltage and the second pixel voltage may be originated from a single image information.

The first switching element may turn on simultaneously with or later than the second switching element. In particular, the first switching element may turn on after a first time period from a start of application of a first data voltage to the data line and turns off before a second time period from an end of the application of the first data voltage and a start of application of a second data voltage to the data line, the second switching element may turn on before the turning off of the first switching element and turns off before a third time period from an end of the application of the second data voltage, and each of the second time period and the third time period may be longer than the first time period.

A turn-on time period of the first switching element may be longer than a turn-on time period of the second switching element.

The first sub-pixel electrode may be surrounded by the second sub-pixel electrode.

One of the first and the second gate lines may overlap at least one of the first and the second sub-pixel electrodes.

The first switching element may include a first electrode connected to the first sub-pixel electrode, the second switching element may include a second electrode connected to the second sub-pixel electrode, and the liquid crystal display may further may include a storage electrode overlapping the first and the second electrodes.

Widths of the first gate line and the second gate line may be different from each other.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF THE EMBODIMENTS

Hereinafter, exemplary embodiments of the present invention will be described in detail with reference to the attached drawings such that the present invention can be easily put into practice by those skilled in the art. The present invention can be embodied in various forms and is not limited to the exemplary embodiments shown herein.

Figure 1A:
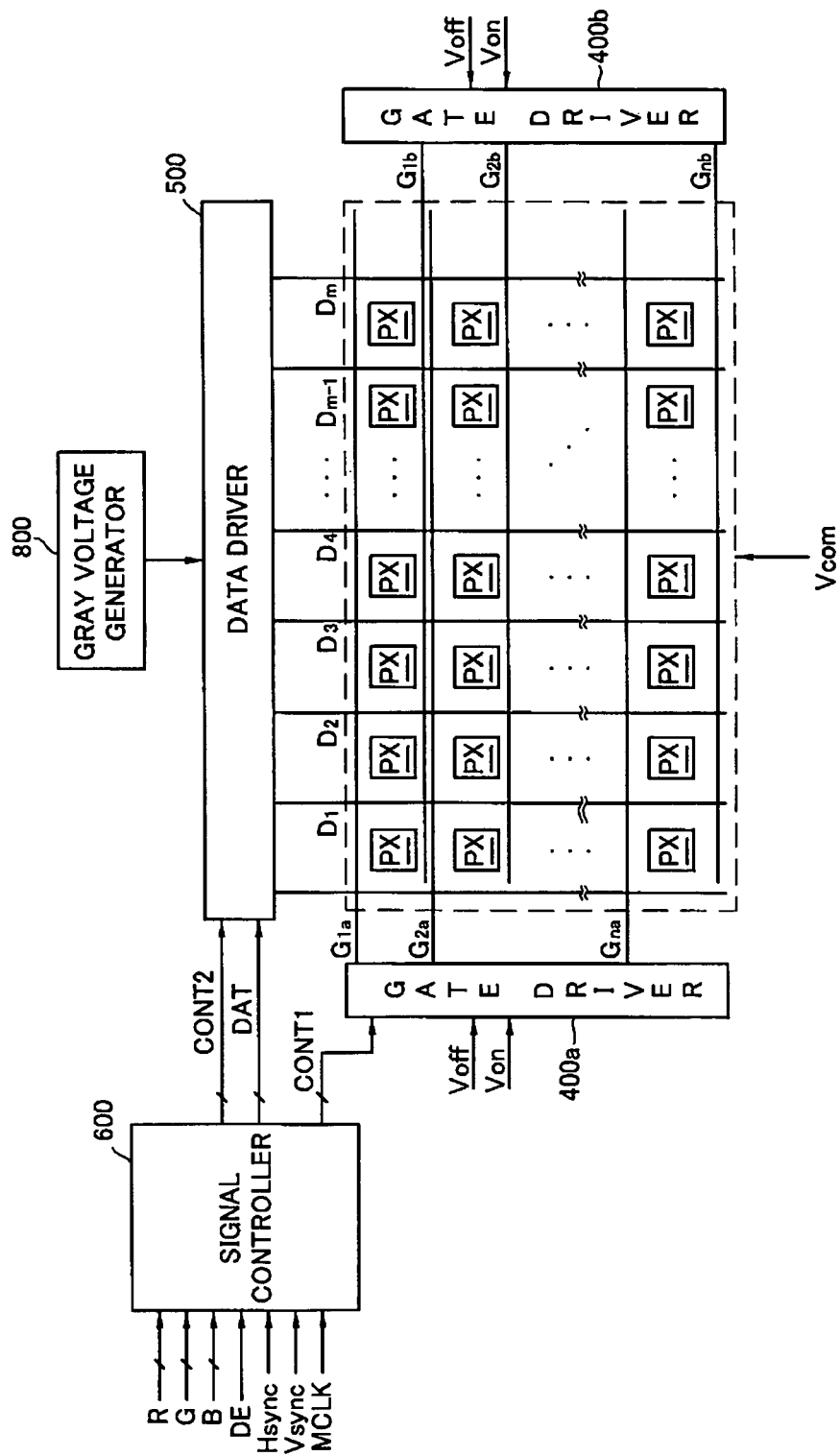
FIGS. 1A to 1C are block diagrams showing a liquid crystal display according to an embodiment of the present invention.
Figure 1B:
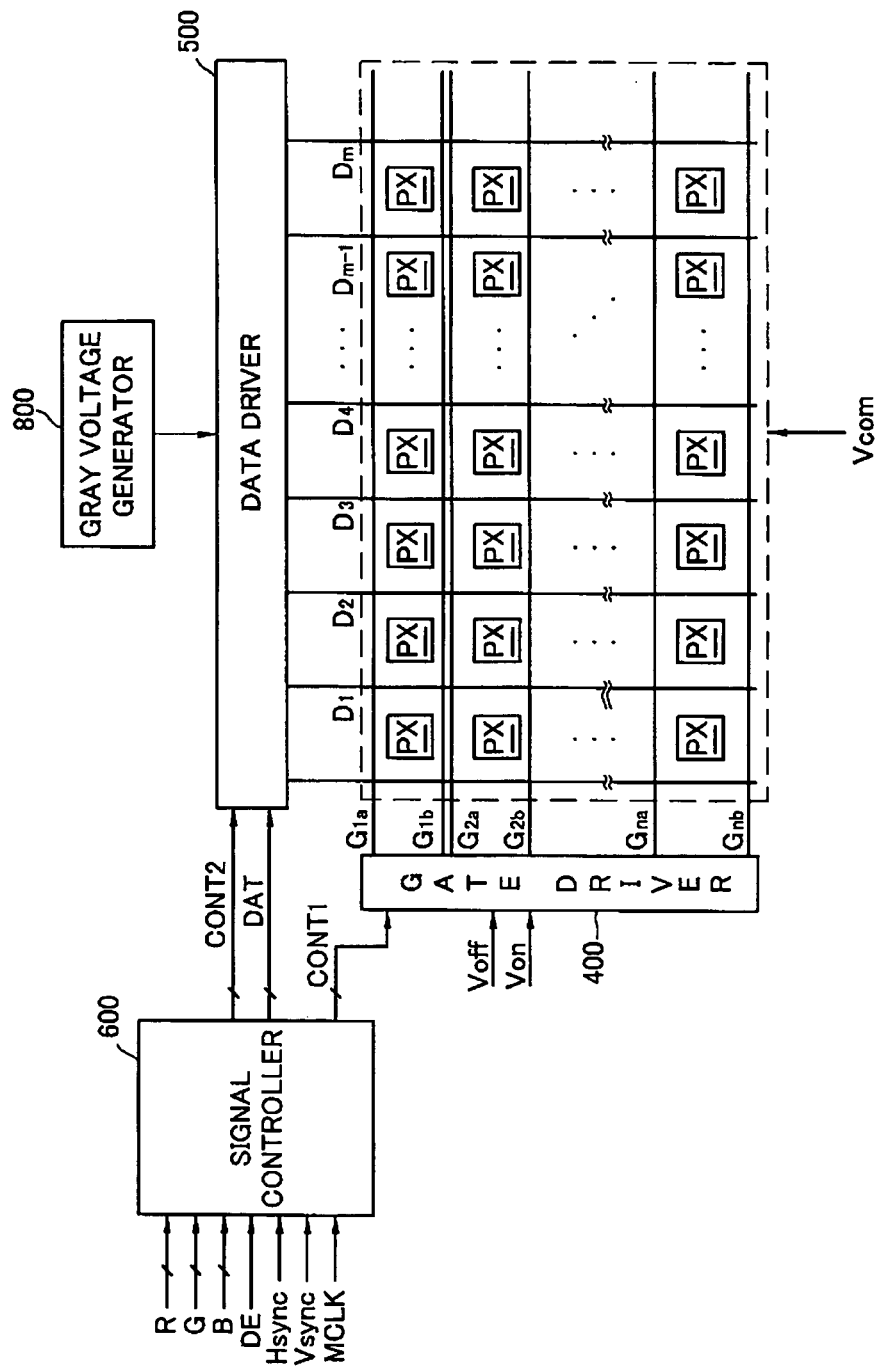
Figure 1C:
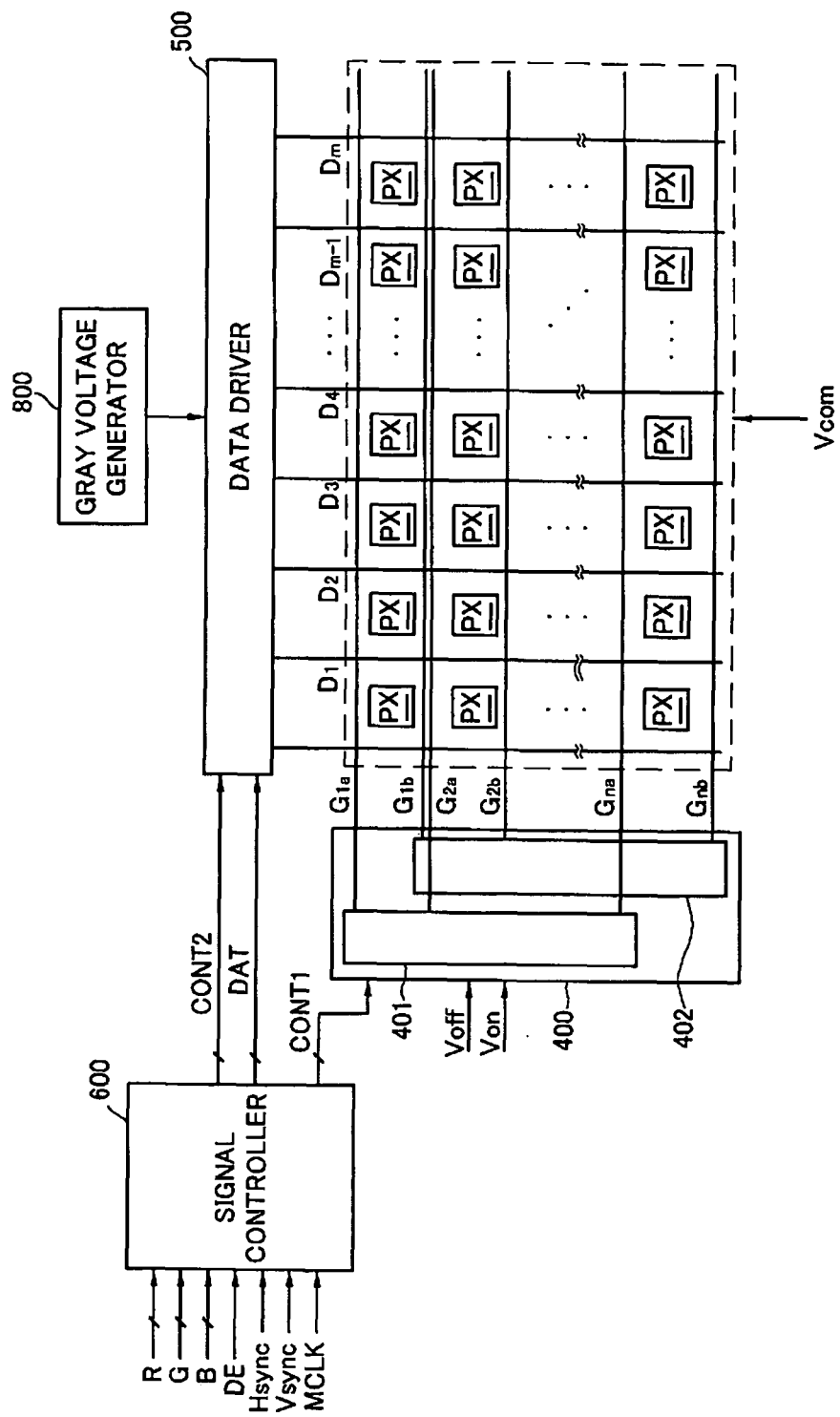
Figure 2:
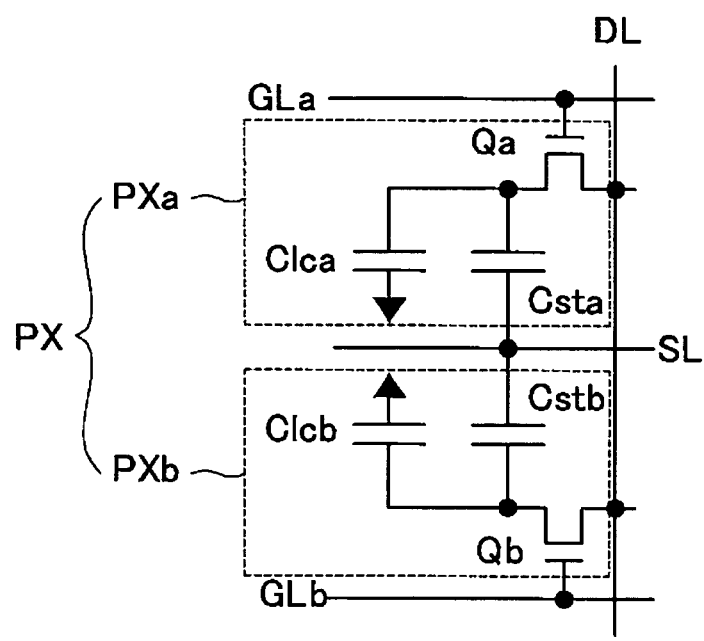
FIG. 2 is an equivalent circuit diagram showing a pixel of the liquid crystal display according to the embodiment of the present invention.
Figure 3:
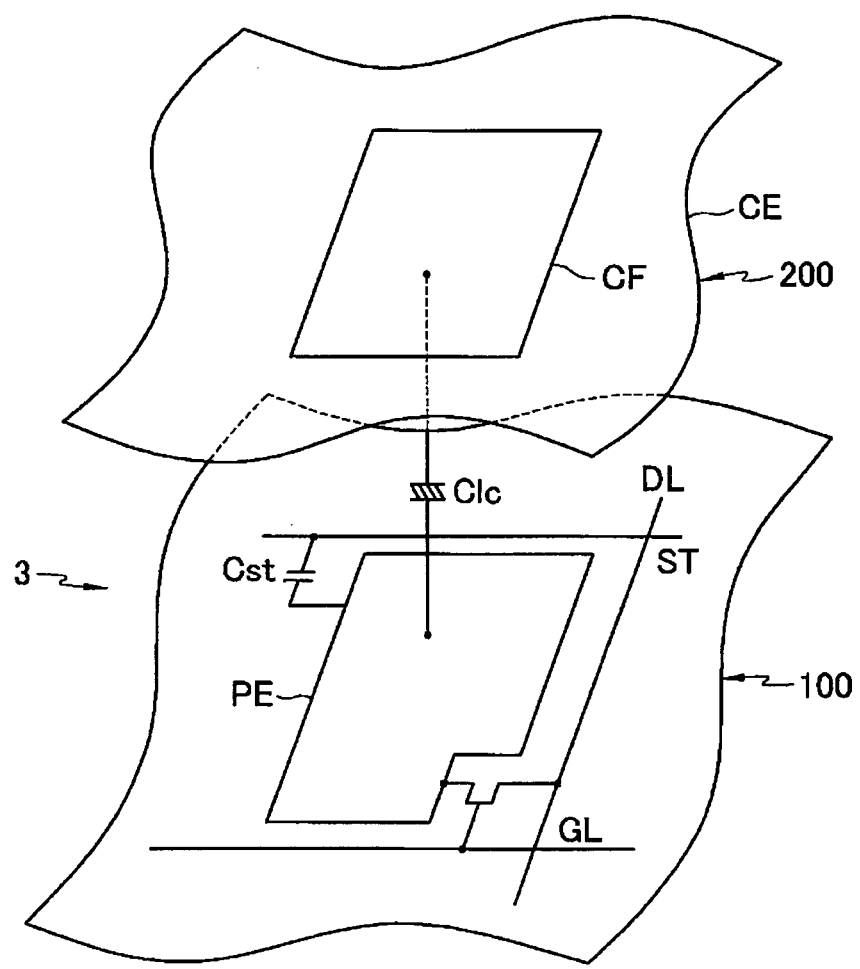
FIG. 3 is an equivalent circuit diagram showing a sub-pixel of the liquid crystal display according to the embodiment of the present invention.

FIGS. 1A to 1C are block diagrams showing a liquid crystal display according to an embodiment of the present invention; FIG. 2 is an equivalent circuit diagram showing a pixel of the liquid crystal display according to the embodiment of the present invention; and FIG. 3 is an equivalent circuit diagram showing a sub-pixel of the liquid crystal display according to the embodiment of the present invention.

As shown in FIGS. 1A to 1C, the liquid crystal display according to the embodiment of the present invention includes a liquid crystal display panel assembly 300, a pair of gate drivers 400a and 400b (or a single gate driver 400) and a data driver 500 connected to the liquid crystal display panel assembly 300, a grayscale voltage generator 800 connected to the data driver 500, and a signal controller 600 for controlling the components.

As seen in the equivalent circuit diagram, the liquid crystal display panel assembly 300 includes a plurality of pixels PX which are connected to a plurality of display signal lines and arranged substantially in a matrix. In addition, as shown in FIG. 3, the liquid crystal display panel assembly includes lower and upper panels 100 and 200 facing each other and a liquid crystal layer 3 interposed therebetween.

The display signal lines include a plurality of gate lines $G_{1a}$ to $G_{nb}$ for transmitting gate signals (sometimes referred to as "scanning signals") and a plurality of data lines $D_1$ to $D_m$ for transmitting data signals. The gate lines $G_{1a}$ to $G_{nb}$ extend parallel to each other substantially in a first direction, and the data lines $D_1$ to $D_m$ extend parallel to each other substantially in a second direction that is perpendicular to the first direction.

In the equivalent circuit diagram of FIG. 2 showing the display signal lines and pixels, in addition to the gate lines denoted by reference numerals GLa to GLb and the data lines denoted by reference numeral DL, the display signal lines include storage electrode lines SL which extend substantially parallel to the gate lines $G_{1a}$ to $G_{nb}$.

Each of the pixels PX includes a pair of sub-pixels PXa and PXb, and the sub-pixels PXa and PXb include switching devices Qa and Qb connected to the corresponding gate lines GLa and GLb and data lines DL, and liquid crystal capacitors Clca and Clcb and storage capacitors Csta and Cstb connected to the switching devices Qa and Qb and storage electrode lines SL. The storage capacitors Csta and Cstb may be omitted as needed. In this case, the storage electrode lines SL are also omitted.

As shown in FIG. 3, the switching devices Q of the sub-pixels PXa and PXb are constructed with thin film transistors and the like, and are disposed in the lower panel 100. Each of the switching devices Q is a three-port device having a control port connected to the gate line GL, an input port connected to the data line DL, and an output port connected to the liquid crystal capacitor Clc and the storage capacitor Cst.

Two ports of the liquid crystal capacitor Clc are a sub-pixel electrode PE of the lower panel 100 and a common electrode CE of the upper panel 200, and the liquid crystal layer 3 interposed between the two electrodes PE and CE serves as a dielectric member. The sub-pixel electrode PE is connected to the switching device Q, and the common electrode CE is disposed on the upper panel 200 to receive a common voltage Vcom. Unlike in FIG. 3, the common electrode CE may be disposed on the lower panel 100, and in this case, at least one of the two electrodes PE and CE may be formed in the shape of a line or a bar.

The storage capacitor Cst having an auxiliary function for the liquid crystal capacitor Clc is constructed by overlapping the sub-pixel electrode lines SL and the sub-pixel electrode PE provided to the lower panel 100 so that they sandwich an insulating member between them, and applying a predetermined voltage such as a common voltage Vcom to the storage electrode line SL. Alternatively, the storage capacitor Cst may be constructed by overlapping the sub-pixel electrode PE and a front gate line disposed just above such that they sandwich an insulating member between them.

In order to implement a color display, each of the pixels uniquely displays a pre-assigned primary color (spatial division), or each of the pixels displays different primary colors at different times (temporal division). A desired color can be obtained by a spatial or temporal combination of the primary colors. Primary colors usually include red, green, and blue. FIG. 3 shows an example of the spatial division. As shown in the figure, each of the pixels includes a color filter CF for representing one of the primary colors, which is provided to a region of the upper panel 200. Unlike in FIG. 3, the color filter CF may be provided above or below the sub-pixel electrode PE of the lower panel 100.

As shown in FIGS. 1A to 1B, the gate drivers 400a and 400b, or 400, are connected to the gate lines $G_{1a}$ to $G_{nb}$ to apply gate signals formed in a combination of a gate-on voltage Von and a gate-off voltage Voff to the gate lines $G_{1a}$ to $G_{nb}$. In FIG. 1A, the gate drivers 400a and 400b are respectively disposed at left and right sides of the liquid crystal display panel assembly 300 to be connected to odd-numbered or even-numbered gate lines $G_{1a}$ to $G_{nb}$. In FIGS. 1B and 1C, the signal gate driver 400 is disposed at one side of the liquid crystal display panel assembly 300 to be connected to all the gate lines $G_{1a}$ to $G_{nb}$. Particularly, in FIG. 1C, two driving circuits 401 an 402 are built in the gate driver 400 to be connected to the odd-numbered and even-numbered gate lines $G_{1a}$ to $G_{nb}$.

The gray voltage generator 800 generates two grayscale voltage sets (reference grayscale sets) corresponding to transmittance of pixels. Two grayscale voltage sets are independently applied to the two sub-pixels of a pixel. Each grayscale voltage set includes a grayscale voltage set having a positive value with respect to the common voltage Vcom and a grayscale voltage set having a negative value with respect to the common voltage Vcom. In some embodiments, instead of the two (reference) grayscale voltage sets, only a single (reference) grayscale voltage set may be generated.

The data driver 500 is connected to the data lines $D_1$ to Dm of the liquid crystal display panel assembly 300 to select one of the two grayscale voltage sets of the grayscale voltage generator 800 and apply one grayscale voltage of the selected grayscale voltage set to the pixel as a data signal. Alternatively, in a case where the grayscale voltage generator 800 generates the reference grayscale voltages instead of all the grayscale voltages, the data driver 500 generates the grayscale voltages by dividing the reference grayscale voltages and selects the data voltage among the generated grayscale voltages.

The gate drivers 400a and 400b or the data driver 500 may be directly mounted in a form of a plurality of driving IC chips on the liquid crystal display panel assembly 300. Alternatively, the gate drivers 400a and 400b or the data driver 500 may be attached in a form of a tape carrier package (TCP) on a flexible printed circuit (FPC) film (not shown) in the liquid crystal display panel assembly 300. In yet another alternative embodiment, the gate driver 400 or the data driver 500 together with the display signal lines $G_{1a}$ to $G_{nn}$ and $D_1$ to $D_m$ and the thin film transistor switching devices Q may be directly mounted on the liquid crystal display panel assembly 300.

The signal controller 600 controls operations of the gate drivers 400a and 400b (or 400), the data driver 500, and the like.

Now, an example of the aforementioned liquid crystal display panel assembly will be described in detail with reference to FIGS. 4 to 11.

Figure 4:
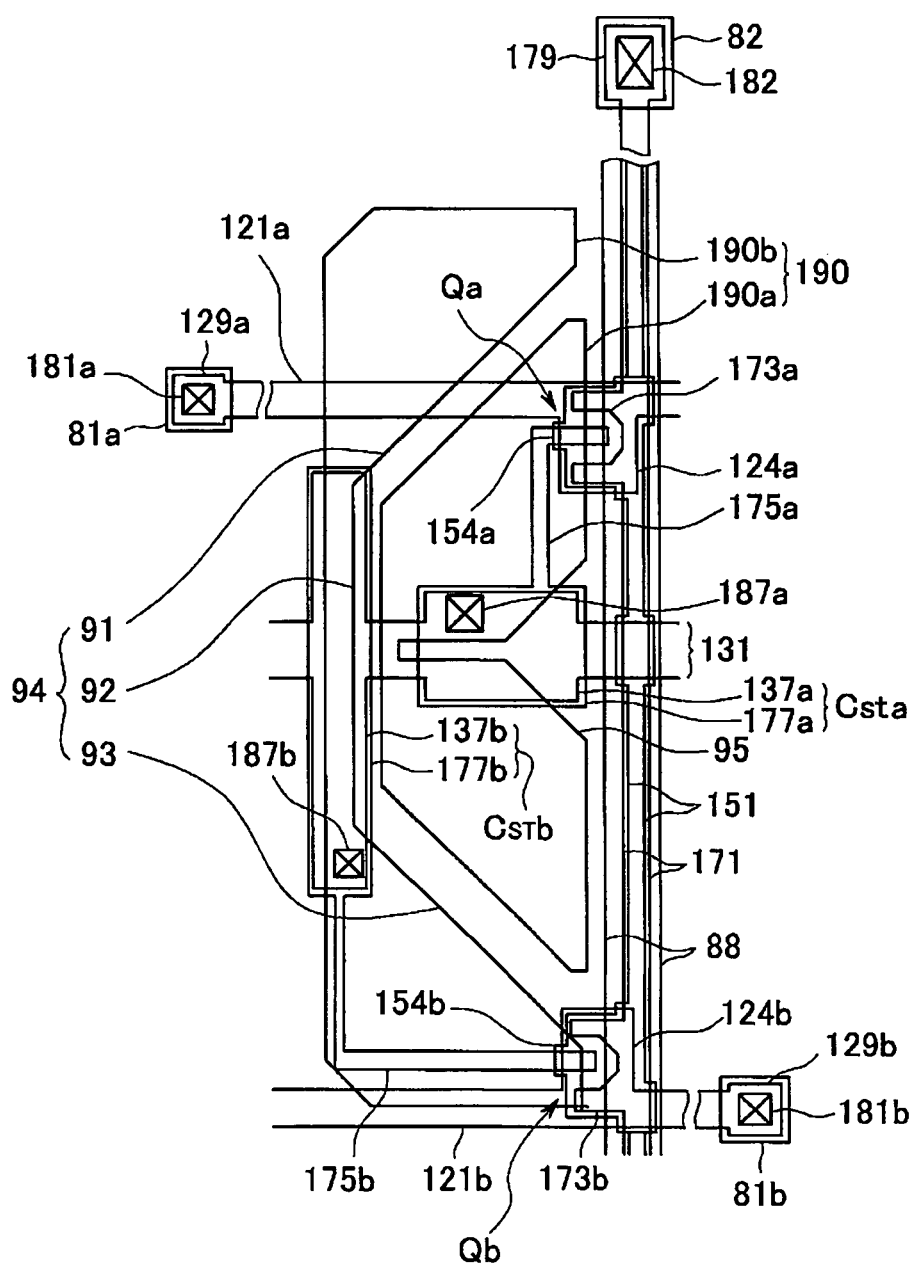
FIG. 4 is a view showing a layout of a lower panel of the liquid crystal display according to the embodiment of the present invention.
Figure 5:
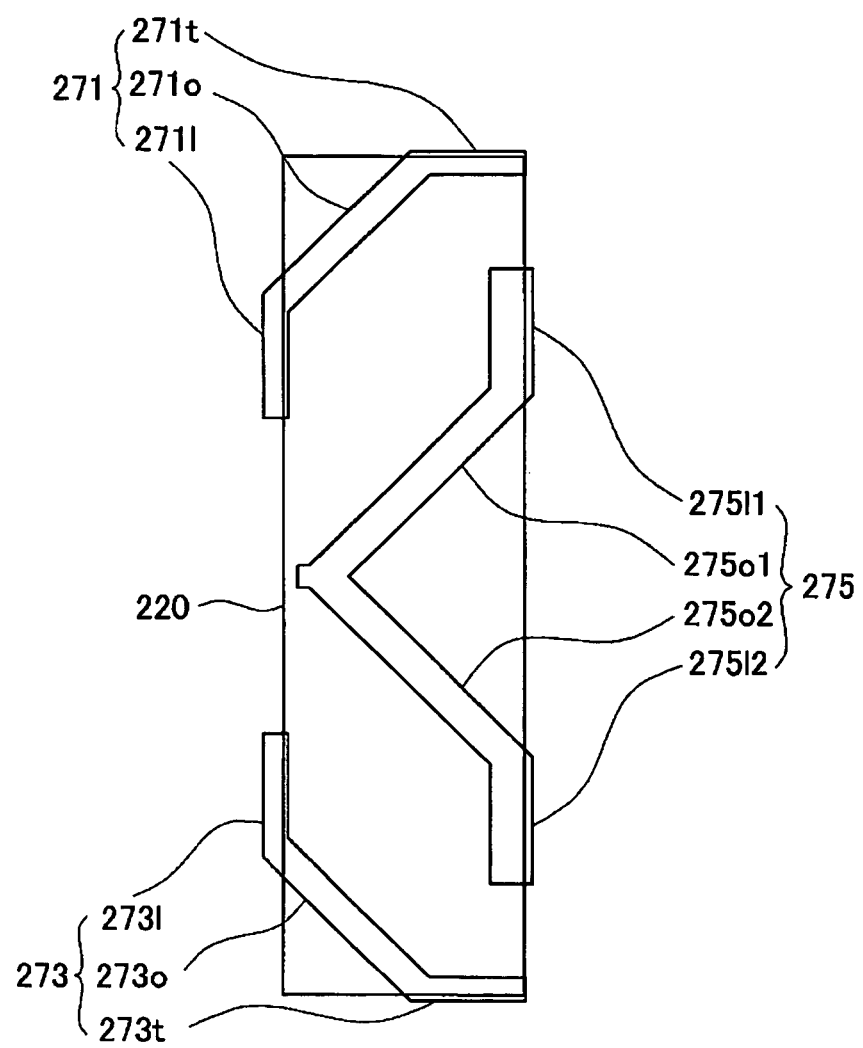
FIG. 5 is a view showing a layout of an upper panel of the liquid crystal display according to the embodiment of the present invention.
Figure 6:
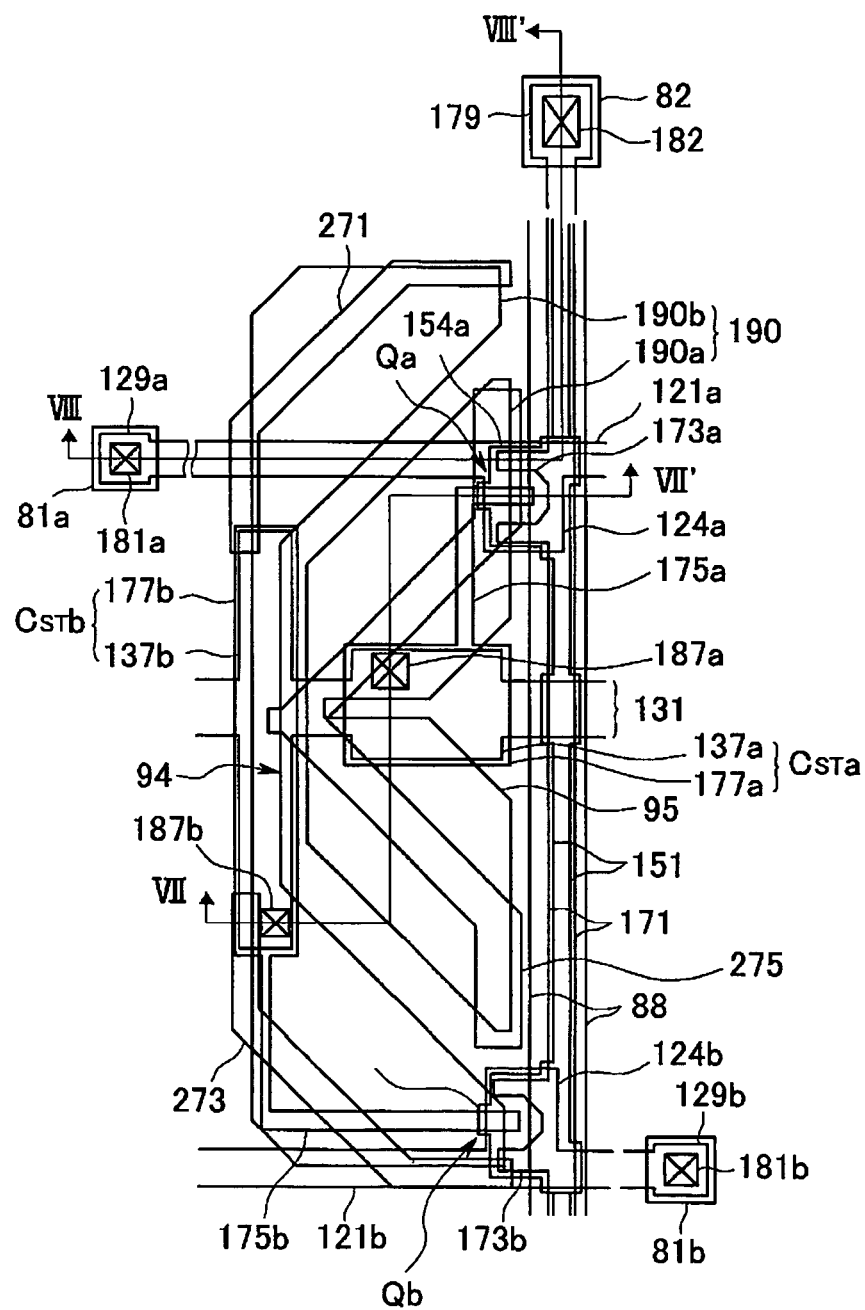
FIG. 6 is a view showing a layout of a liquid crystal display panel assembly including the lower and upper panels of FIGS. 4 and 5.
Figure 7:
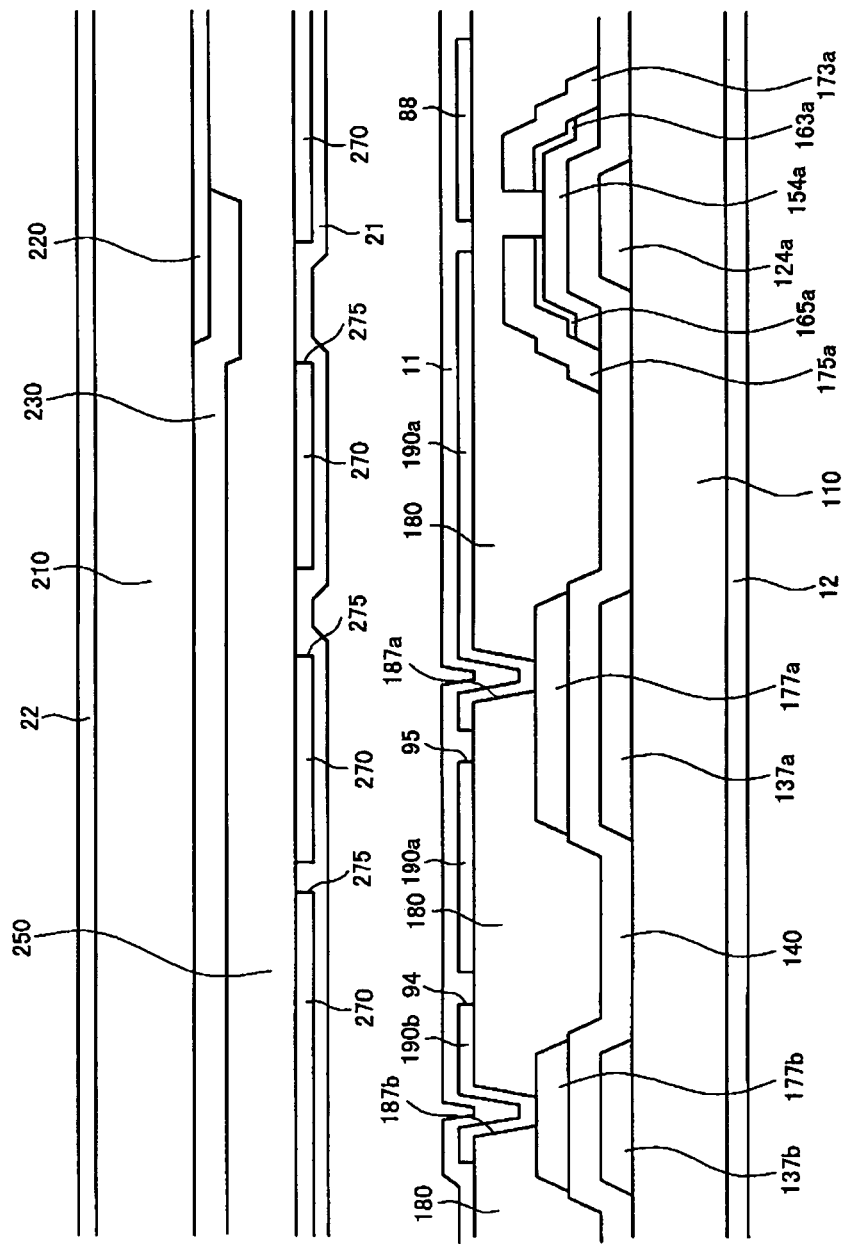
FIGS. 7 and 8 are sectional views showing the liquid crystal panel assembly taken along lines VII-VII' and VIII-VIII' of FIG. 6, respectively.
Figure 8:
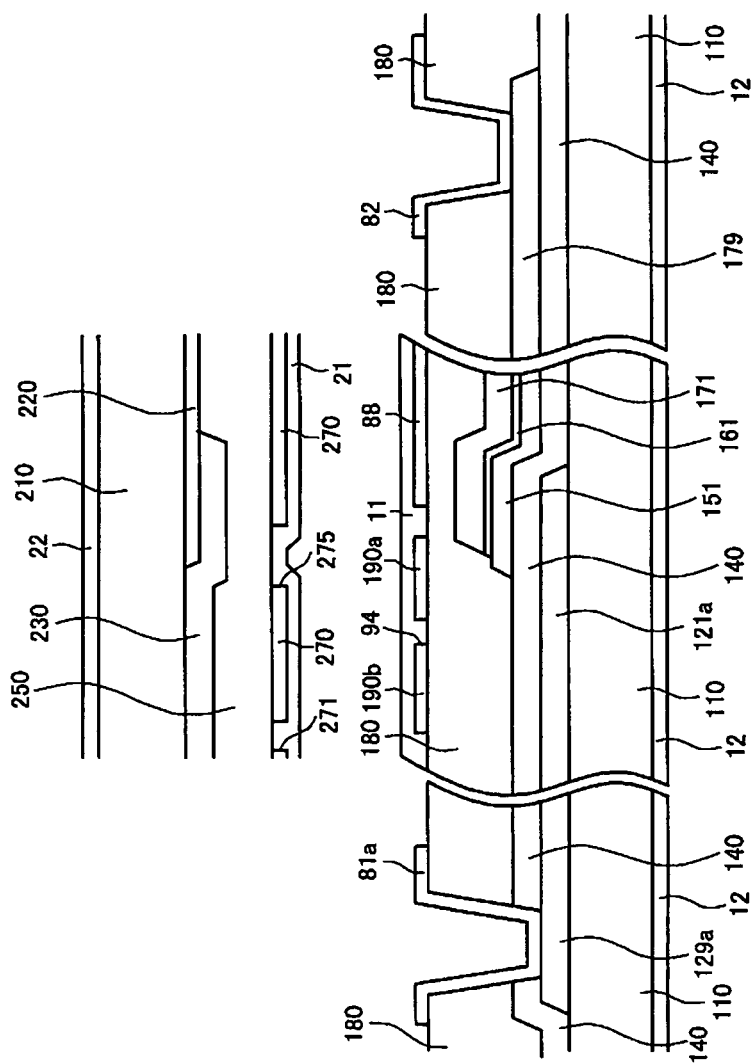

FIG. 4 is a view showing a layout of a lower panel of the liquid crystal display according to the embodiment of the present invention; FIG. 5 is a view showing a layout of an upper panel of the liquid crystal display according to the embodiment of the present invention; FIG. 6 is a view showing a layout of a liquid crystal display panel assembly including the lower and upper panels of FIGS. 4 and 5; and FIGS. 7 and 8 are cross-sectional views showing the liquid crystal panel assembly taken along lines VII-VII' and VIII-VIII' of FIG. 6, respectively.

Referring to FIGS. 4 to 8, the liquid crystal display panel assembly 300 according to the embodiment includes a lower panel 100, an upper panel 200 overlapping the lower panel 100, and a liquid crystal layer 3 interposed between the lower and upper panels 100, 200.

Firstly, the lower panel 100 will be described in detail with reference to FIGS. 4 and 6 to 8.

A plurality of first and second gate lines 121a and 121b and a plurality of storage electrode lines 131 are disposed on an insulating substrate 110 made of transparent glass or the like.

The gate lines 121a and 121b mainly extend in a first direction (e.g., the transverse direction in FIG. 4) and are physically and electrically separated from each other to transmit gate signals. The first and second gate lines 121a and 121b disposed in upper and lower sides include a plurality of first and second gate electrodes 124a and 124b protruding in upward and downward directions relative to FIG. 4, and a plurality of end portions 129a and 129b disposed at left and right sides having a wide area for connection to other layers or external apparatuses. Alternatively, the end portions 129a and 129b may be disposed at one side, that is, either the left or right side.

The storage electrode lines 131 mainly extend in the first direction and are disposed to be close to the first gate lines 121a rather than the second gate lines 121b. Each of the storage electrode lines 131 includes a plurality of pairs of a first and a second storage electrode 137a and 137b. The length and width of each first storage electrode 137a are respectively larger and smaller than those of each second storage electrode 137b. However, shapes and arrangement of the storage electrodes 137a, 137b and the storage electrode lines 131 may be modified in various manners.

The gate lines 121a and 121b and the storage electrode lines 131 are preferably made of an aluminum-based metal such as aluminum (Al) and an aluminum alloy, a silver-based metal such as silver (Ag) and a silver alloy, a copper-based metal such as copper (Cu) and a copper alloy, a molybdenum-based metal such as molybdenum (Mo) and a molybdenum alloy, chromium (Cr), titanium (Ti), or tantalum (Ta). However, the gate lines 121a and 121b and the storage electrode lines 131 may have a multi-layered structure including two conductive layers (not shown) having different physical properties. One of the two conductive layers is made of a metal having low resistivity, for example, an aluminum-based metal, a silver-based metal, and a copper-based metal, in order to reduce signal delay or voltage drop of the gate lines 121a and 121b and the storage electrode lines 131. The other conductive layers are made of a material having good contact characteristics to other materials, particularly to ITO (indium tin oxide) and IZO (indium zinc oxide), such as a molybdenum-based metal, chromium, titanium, and tantalum. As preferred examples thereof, there are a combination of a lower chromium layer and an upper aluminum layer and a combination of a lower aluminum layer and an upper molybdenum layer. However, the examples provided above are not limiting and the gate lines 121a and 121b and the storage electrode lines 131 may be made of various metals and conductive materials not explicitly listed herein.

The side surfaces of the gate lines 121a and 121b and the storage electrode lines 131 are slanted with respect to a surface of the substrate 110 so as to form an angle in the range of 30° to 80° with respect to the substrate 110.

A gate insulating film 140 made of a silicon nitride $SiN_x$ or the like is formed on the gate lines 121a and 121b and the storage electrode lines 131.

A plurality of semiconductor stripes 151 made of hydrogenated amorphous silicon or polysilicon are formed above the gate insulating film 140. The semiconductor stripes 151 mainly extend in a second direction that is substantially perpendicular to the first direction, and include a plurality of first and second protrusions 154a and 154b extending toward the first and second gate electrodes 124a and 124b. In addition, widths of the semiconductor stripes 151 are enlarged at intersections of the gate lines 121a and 121b and the storage electrode lines 131 to cover wide areas of the gate lines 121a and 121b and the storage electrode lines 131.

A plurality of ohmic contact stripes and islands 161 and 165a made of a silicide or an n+ hydrogenated amorphous silicon or the like which are heavily doped with n-type impurities are formed above the semiconductor stripes 151. The ohmic contact stripes 161 have a plurality of protrusions 163a, and the protrusions 163a and the ohmic contact islands 165a constituting pairs are disposed on the first protrusions 154a of the semiconductor stripes 151. On the other hand, although not shown in the figure, protrusions of the ohmic contact stripes 161 and the ohmic contact islands constituting pairs thereof are also disposed on the second protrusions 154b of the semiconductor stripes 151.

As shown in FIGS. 7 and 8, the side surfaces of the semiconductor stripes 151 and the ohmic contact members 161 and 165a are slanted with respect to the surface of the substrate 110 to form an angle in the range of 30° to 80° with respect to the substrate 110.

A plurality of data lines 171 and a plurality of first and second drain electrodes 175a and 175b are formed on the ohmic contact members 161 and 165a and the gate insulating film 140.

The data lines 171 mainly extend in the second direction to intersect the gate lines 121a and 121b and the storage electrode lines 131, and transmit the data voltages. The data lines 171 have a plurality of first and second source electrodes 173a and 173b which extend toward the first and second drain electrodes 175a and 175b, and end portions 179 which have enlarged widths for connection to other layers or external apparatuses.

The first/second drain electrode 175a/175b has a bar-shaped end portion disposed on the first/second protrusions 154a/154b of the semiconductor stripes 151 and an enlarged portion 177a/177b extending from the bar-shaped end portion. The enlarged portion 177a/177b has a large area and overlaps the first/second storage electrode 137a/137b. The source electrodes 173a and 173b are curved to surround the bar-shaped end portions of the drain electrodes 175a and 175b. The first/second gate electrode 124a/124b, the first/second source electrode 173a/173b, and the first/second drain electrode 175a/175b together with a protrusion 154a/154b of a semiconductor stripe 151 constitute a first/second thin film transistor (TFT) Qa/Qb, and channels of the thin film transistor Qa/Qb is formed on the protrusion 154a/154b between the first/second source electrode 173a/173b and the drain electrode 175a/175b.

The data lines 171 and the drain electrodes 175a and 175b are preferably made of chromium, a molybdenum-based metal, or a refractory metal such as tantalum and titanium, and may have a multi-layered structure which is constructed with a lower layer (not shown) made of the refractory metal and an upper layer (not shown) made of a low resistance material. As an example of the multi-layered structure, in addition to the aforementioned two-layered structure of a lower chromium or molybdenum layer and an upper aluminum layer, there is a three-layered structure of a lower molybdenum layer, an intermediate aluminum layer, and an upper molybdenum layer.

Like the gate lines 121a and 121b and the storage electrode lines 131, the side surfaces of the data lines 171 and the drain electrodes 175a and 175b are slanted to form an angle ranging from 30° to 80° with respect to the substrate surface.

The ohmic contact members 161 and 165a are interposed only between the underlying semiconductor stripes 151 and the overlying data lines 171 and drain electrodes 175a and 175b, and have a function of reducing the contact resistance between the semiconductor stripes 151 and the overlying layers. The semiconductor stripes 151 have exposed portions which are not covered with the data lines 171 and the drain electrodes 175a and 175b, for example portions disposed between the source electrodes 173a and 173b and the drain electrodes 175a and 175b. In most areas, the widths of the line-shaped semiconductor stripes 151 are smaller than those of the data lines 171, but, as described above, the widths thereof are enlarged at the intersections of the gate lines 121a and 121b and the storage electrode lines 131. This way, the profile of surfaces are smoothed and the disconnection of the data lines 171 can be prevented.

A protective film (passivation layer) 180 is formed on the data lines 171, the drain electrodes 175a and 175b, and the exposed portions of the semiconductor stripes 151. The protective film 180 is made of an inorganic material such as silicon nitride and silicon oxide, an organic material having an excellent planarization property and photosensitivity, and/or a low dielectric-constant insulating material formed with plasma enhanced chemical vapor deposition (PECVD) such as a-Si:C:O and a-Si:O:F. In order to make use of the excellent properties of an organic film and protect the exposed portions of the semiconductor stripes 151, the protective film 180 may have a two-layered structure of a lower inorganic film and an upper organic film.

In the protective film 180, a plurality of contact holes 182, 185a, and 185b which expose the end portions 179 of the data lines 171 and the enlarged portions 177a and 177b of the drain electrodes 175a and 175b, respectively, are formed. In the protective film 180 and the gate insulating film 140, a plurality of contact holes 181a and 181b which expose the end portions 129a and 129b of the gate lines 121a and 121b, respectively, are formed.

On the protective film 180, a plurality of pixel electrodes 190 including a plurality of first and second sub-pixel electrodes 190a and 190b, a plurality of shielding electrodes 88, and a plurality of contact assistance members 81a, 81b, and 82 are formed. The pixel electrodes 190, the shielding electrodes 88, and the contact assistance members 81a, 81b, and 82 are made of a transparent conductive material such as ITO and IZO or a reflective conductive material such as aluminum.

The first and second sub-pixel electrodes 190a and 190b are physically and electrically connected through the contact holes 185a and 185b to the first and second drain electrodes 175a and 175b to receive data voltages from the first and second drain electrodes 175a and 175b.

The sub-pixel electrodes 190a and 190b supplied with the data voltages generate an electric field together with a common electrode 270, so that alignment of the liquid crystal molecules of the liquid crystal layer 3 between the two electrodes 190 and 270 can be controlled.

As described above, the sub-pixel electrodes 190a and 190b and the common electrode 270 constitute the liquid crystal capacitors Clca and Clcb to sustain the applied voltages even when the thin film transistors Qa and Qb turn off. In order to increase the voltage storage capability, the storage capacitors Csta and Cstb connected in parallel with the liquid crystal capacitors Clca and Clcb are constructed by overlapping the first and second sub-pixel electrodes 190a and 190b and the first and second drain electrodes 175a and 175b connected thereto with the first and second storage electrodes 137a and 137b.

The upper right corner of each pixel electrode 190 is chamfered, and the chamfered edge makes an angle of about 45° with respect to the gate lines 121a and 121b.

The first and second sub-pixel electrodes 190a and 190b constituting one pixel electrode 190 are engaged with each other with a gap 94 interposed therebetween. The outer boundary of the pixel electrode 190 has the shape of an approximate rectangle. The first sub-pixel electrode 190a has a shape of a rotated equilateral trapezoid which has a first edge in the vicinity of the second storage electrode 137b, a second edge opposite thereto, and upper and lower oblique edges having an angle of about 45° with respect to the gate lines 121a and 121b. The second sub-pixel electrode 190b includes a pair of trapezoidal portions facing oblique edges of the first sub-pixel electrode 190a and longitudinal portions facing the first edge of the first sub-pixel electrode 190a. The gap 94 between the first and second sub-pixel electrodes 190a and 190b includes upper and lower oblique portions 91 and 93 having a substantially uniform width and an angle of about 45° with respect to the gate lines 121a and 121b and a longitudinal portion 92 having a substantially uniform width.

The first sub-pixel electrode 190a has a cutout 95 extending along the storage electrode line 131, and is divided into upper and lower half partitions by the cutout 95. The cutout 95 has an inlet at the right edge of the first sub-pixel electrode 190a, and the inlet of the cutout 95 has a pair of oblique edges which are substantially parallel to the upper and lower oblique edges 91 and 93 of the gap 94. The gap 94 and the cutouts 95 have approximate inversion symmetry with respect to the storage electrode line 131.

Here, the number of partitions or the number of cutouts may vary according to the size of a pixel, the aspect ratio of the pixel electrodes 190, the type or characteristics of the liquid crystal layer 3, or other design factors. Hereinafter, for convenience of description, the gap 94 is also referred to as a cutout.

The first sub-pixel electrode 190a overlaps the first gate line 121a, and the second sub-pixel electrode 190b overlaps both the first and second gate lines 121a and 121b. The first gate line 121a passes through a central portion of the upper half region of the pixel electrode 190.

The shielding electrodes 88 extend along the data lines 171 and entirely cover the data lines 171. In order to apply a common voltage to the shielding electrodes 88, the shielding electrodes 88 may be connected to the storage electrode lines 131 or short points (not shown) through contact holes (not shown) in the protective film 180 and the gate insulating film 140. The common voltage is transmitted from the thin film transistor panel 100 to the common electrode panel 200 through the storage electrode lines 131 or short points (not shown). Here, it is preferable that the distance between the shielding electrode 88 and the pixel electrode 190 is minimized in order to minimize a decrease in the aperture ratio.

This way, if the shielding electrodes 88 applied with the common voltage are disposed over the data lines 171, the shielding electrodes 88 shield the electric field generated between the data lines 171 and the pixel electrodes 190 and between the data lines 171 and the common electrode 270, so that voltage distortion of the pixel electrodes 190 and signal delay of data voltage transmitted by the data lines 171 can be reduced.

In addition, since the pixel electrodes 190 and the shielding electrodes 88 are separated from each other by a distance in order to prevent a short-circuit from forming between them, the pixel electrodes 190 can be further separated from the data lines 171, reducing the parasitic capacitance between the pixel electrodes 190 and the data lines 171. In addition, since the permittivity of the liquid crystal layer 3 is higher than that of the protective film 180, the parasitic capacitance between the data lines 171 and the shielding electrodes 88 is lower than the parasitic capacitance between the data lines 171 and the common electrode 270 where the shielding electrode 88 is not provided.

In addition, since the pixel electrodes 190 and the shielding electrodes 88 are constructed with the same layer, the distance between them can be uniformly maintained, so that the parasitic capacitance between them is uniform. The parasitic capacitance between the pixel electrodes 190 and the data lines 171 may be different in different exposure areas defined in a division exposure process since the parasitic capacitance between the pixel electrodes 190 and the data lines 171 is relatively reduced. However, the overall parasitic capacitance is considered to be substantially uniform. to the uniform parasitic capacitance helps reduce stitch defects.

The contact assistance members 81a, 81b, and 82 are connected through the contact holes 181a, 181b, and 182 to the end portions 129a and 129b of the gate lines 121a and 121b and the end portions 179 of the data lines 171, respectively (see FIG. 4). The contact assistance members 81a, 81b, and 82 have a function of aiding the adhesion of the exposed end portions 129a and 129b of the gate lines 121a and 121b and the exposed end portions 179 of the data lines 171 to external apparatuses, and protecting these portions.

As shown in FIGS. 1A to 1C, in a case where the gate drivers 400a and 400b or the data driver 500 are integrated on the liquid crystal display panel assembly 300, the gate lines 121a and 121b or the data lines 171 extend to be directly connected thereto. In this case, the contact assistance members 81a, 81b, and 82 may be used to connect the gate lines 121a and 121b or the data lines 171 to the drivers 400a, 400b, and 500.

An alignment film 11 for aligning the liquid crystal layer 3 is coated on the pixel electrode 190 and the protective film 180.

Now, the upper panel 200 will be described with reference to FIGS. 5 to 8.

A light-blocking member 220 (often called the black matrix) for preventing light leakage is formed on a dielectric substrate 210 made of transparent glass or the like. The light-blocking member 220 includes a plurality of openings which face the pixel electrodes 190 and have substantially the same shape as the pixel electrodes 190. Alternatively, the light-blocking member 220 may be constructed with portions corresponding to the data lines 171 and portions corresponding to the thin film transistors. However, these are not limitations of the invention and the light-blocking member 220 may have any suitable shape for preventing light leakage in a vicinity of the pixel electrodes 190 and the thin film transistors Qa and Qb.

A plurality of color filters 230 are formed on the substrate 210. Most portions of each of the color filters 230 are disposed in a region surrounded by the light-blocking member 220, and the color filters 230 extend along the pixel electrodes 190 in the second direction. Each of the color filters 230 can represent one of primary colors such as red, green, and blue.

A cover film 250 is formed on the color filters 230 and the light-blocking member 220 in order to prevent the color filters 230 from being exposed and to provide a flat surface.

A common electrode 270 made of a transparent conductive material such as ITO and IZO is formed on the cover film 250.

The common electrode 270 includes a plurality of cutout sets 271, 273, and 275.

Each of the cutout sets 271, 273, and 275 faces one pixel electrode 190 and includes an upper cutout 271, a central cutout 275, and a lower cutout 273. Each of the cutouts 271, 273, and 275 is disposed between adjacent cutouts 94 and 95 of the pixel electrode 190 or between a cutout 94 and an oblique edge of the pixel electrode 190. In addition, each of the cutouts 271, 273, and 275 include at least one oblique portion 271o, 273o, 275o1, or 275o2 which extend parallel to the upper or lower oblique portion 91 or 93 of the gap 94 and has approximate inversion symmetry with respect to the storage electrode line 131.

Each of the upper and lower cutouts 271 and 273 includes an oblique portion 271o/273o, a transverse portion 271t/273t that extends in the first direction, and a longitudinal portion 271l/273l that extends in the second direction. The oblique portion 271o/273o extends substantially from the left edge of the pixel electrode 190 toward the upper/lower edge of the pixel electrode 190. The transverse portion 271t/273t and the longitudinal portion 271l/273l extend from ends of the oblique portion 271o/273o along edges of the pixel electrode 190, make an obtuse angle with the oblique portion 271o/273o, and overlap the edges of the pixel electrode 190.

The central cutout 275 includes a pair of oblique portions 275o1 and 275o2 and longitudinal portions 275l1 and 275l2. The oblique portions 275o1 and 275o2 extend substantially from the left edge of the pixel electrode 190 to the right edge of the pixel electrode 190 in an oblique direction. The longitudinal portions 275l1 and 275l2 extend from the ends of the oblique portions 275o1 and 275o2 along the right edge of the pixel electrode 190, make an obtuse angle with the oblique portions 275o1 and 275o2, and overlap the right edge of the pixel electrode 190.

The number of the cutouts 271, 273, and 275 may vary according to the design factors, and the light-blocking member 220 overlaps the cutouts 271, 273, and 275 to prevent light leakage in a vicinity of the cutouts 271, 273, and 275.

An alignment film 21 for aligning the liquid crystal molecules is coated on the common electrode 270.

Polarizing plates 12 and 22 are provided on outer surfaces of the panels 100 and 200. Transmission axes of two polarizing plates 12 and 22 are perpendicular to each other, and one of the transmission axes (or absorbing axes) is parallel to the transverse direction. In the case of a reflective type of liquid crystal display, one of the two polarizing plates 12 and 22 may be omitted.

The liquid crystal layer 3 has negative anisotropic permittivity, and the liquid crystal molecules are aligned such that their major axes are perpendicular to the surfaces of the two panels 100 and 200 when no electric field is applied to the liquid crystal molecules.

When the common voltage is applied to the common electrode 270 and the data voltage is applied to the pixel electrode 190, an electric field is generated in a direction substantially perpendicular to the surfaces of the panels 100 and 200. The cutouts 94, 95, 271, 273, and 275 of the electrodes 190 and 270 distort the electric field to generate a horizontal component which is perpendicular to the edges of the cutouts 94, 95, 271, 273, and 275. Accordingly, the direction of the electric field forms an angle with respect to a direction that is normal to the surfaces of the panels 100 and 200. In response to the electric field, the liquid crystal molecules have a tendency to change the direction of the major axis to be perpendicular to the direction of the electric field. Since the electric field in a vicinity of the cutouts 94, 95, 271, 273, and 275 and the edges of the pixel electrode 190 make an angle with the major axes of the liquid crystal molecules rather than being parallel to the major axes, the liquid crystal molecules rotate in such a way that the moving distance of the liquid crystal molecules on a surface spanned by the major axis of the liquid crystal molecules and the electric field is short. Therefore, one group of the cutouts 94, 95, 271, 273, and 275 and the edges of the pixel electrode 190 divide the region of the liquid crystal layer 3 located on the pixel electrode 190 into a plurality of domains where the liquid crystal molecules have different tilt angles. This way, it is possible to increase the reference viewing angle.

At least one of the cutouts 94, 95, 271, 273, and 275 may be replaced with protrusions (not shown) or recessed portions, and their shapes and arrangements of the cutouts 94, 95, 271, 273, and 275 may be modified in various manners.

Now, a liquid crystal display panel assembly according to another embodiment of the present invention will be described with reference to FIGS. 9 to 11.

Figure 9:
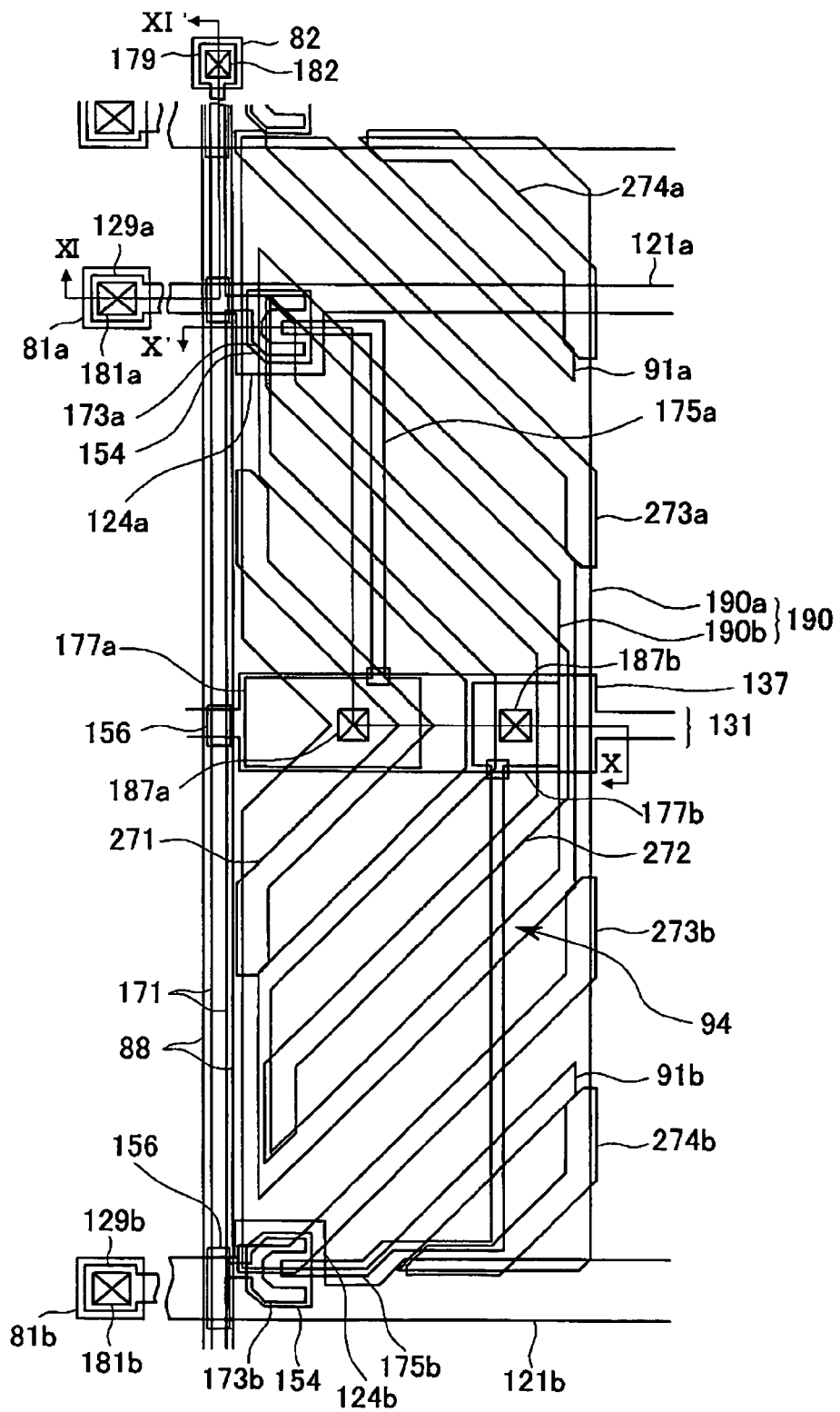
FIG. 9 is a view showing a layout of a liquid crystal display panel assembly according to another embodiment of the present invention.
Figure 10:
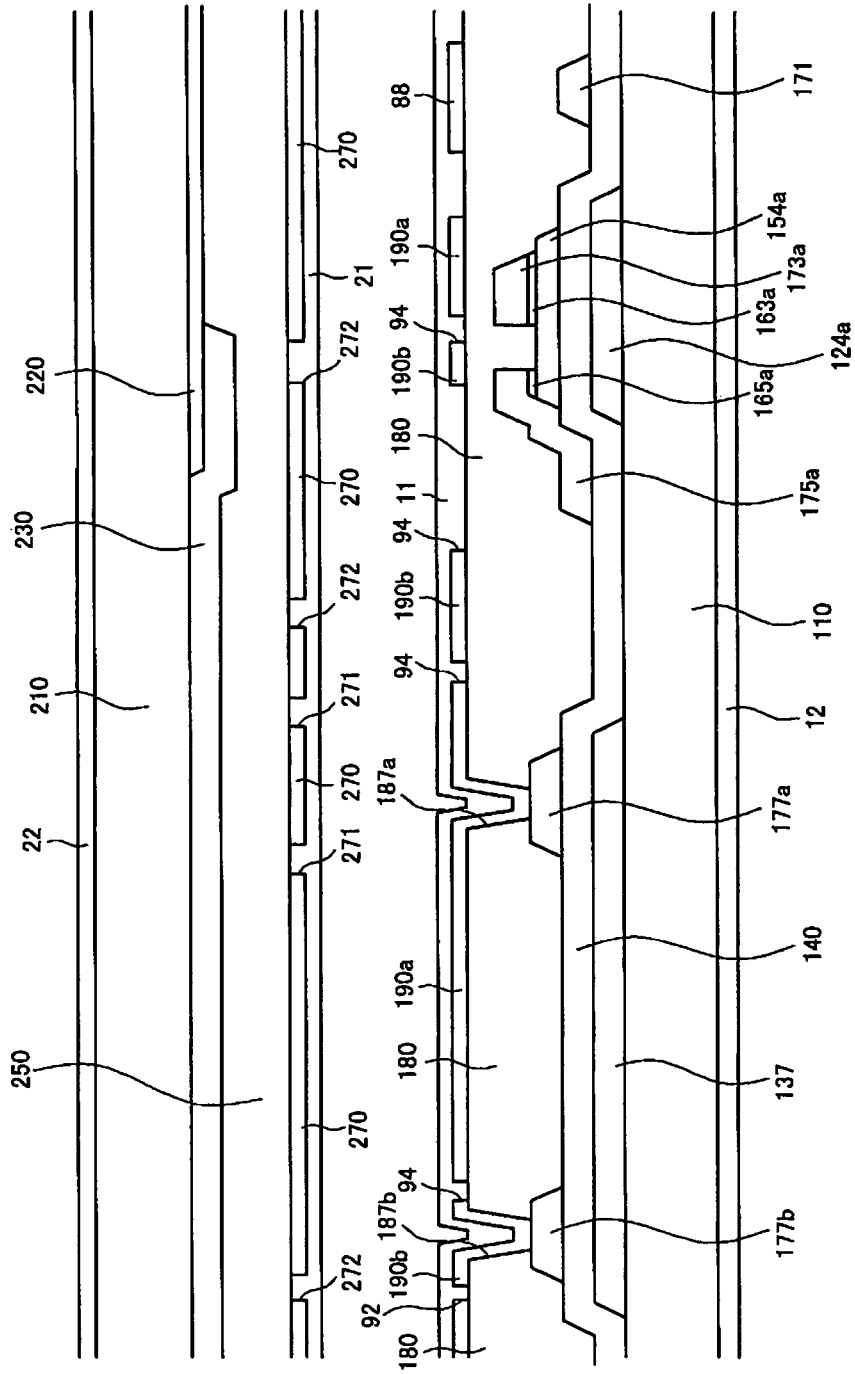
FIGS. 10 and 11 are cross-sectional views showing the liquid crystal panel assembly taken along lines X-X' and XI-XI' of FIG. 9, respectively.
Figure 11:
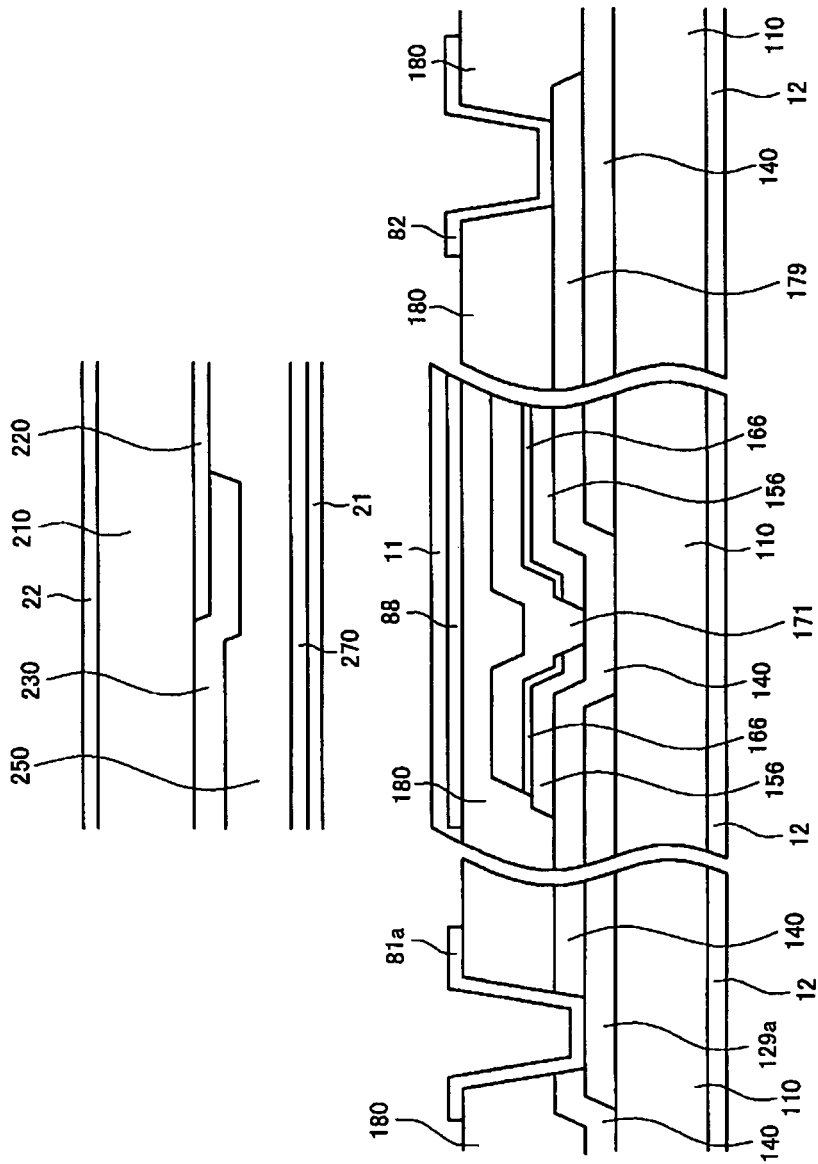

FIG. 9 is a view showing a layout of the liquid crystal display panel assembly according to another embodiment of the present invention; and FIGS. 10 and 11 are cross-sectional views showing the liquid crystal panel assembly taken along lines X-X' and XI-XI' of FIG. 9, respectively.

Referring to FIGS. 9 to 11, the liquid crystal display panel assembly 300 according to the embodiment includes a lower panel 100, an upper panel 200 facing the lower panel 100, and a liquid crystal layer 3 interposed therebetween.

The layered structures of the panels 100 and 200 according to the embodiments are substantially the same as the layered structures of FIGS. 4 to 6.

In the upper panel (thin film transistor array panel) 100, a plurality of pairs of gate lines 121a and 121b including gate electrodes 124a and 124b and a plurality of storage electrode lines 131 including storage electrodes 137 are formed on a substrate 110, and a gate insulating film 140, a plurality of semiconductors 154, and a plurality of island-shaped ohmic contact members 163a and 163b are sequentially formed thereon. A plurality of data lines 171 including source electrodes 173a and 173b and a plurality of drain electrodes 175a and 175b are formed on the gate insulating film 140, and a protective film 180 is formed thereon. On the protective film 180, a plurality of contact holes 181a, 181b, 182, 187a, and 187b are formed. A plurality of pixel electrodes 190 including first and second pixel electrodes 190a and 190b, a plurality of shielding electrodes 88, and a plurality of contact assistance members 81a, 81b, and 82 are formed on the protective film 180, and an alignment film 11 is coated thereon.

In the lower panel (common electrode panel) 200, a light-blocking member 220, a plurality of color filters 230, a cover film 250, a common electrode 270 including a plurality of cutouts 271, 272, 273a, 273b, 274a, and 274b, and an alignment film 21 are formed on a dielectric substrate 210.

The liquid crystal display panel assembly according to the embodiment is different from the liquid crystal display panel assembly shown in FIGS. 4 to 8 primarily in the shapes of the pixel electrodes 190. More specifically, the second sub-pixel electrode 190b has a trapezoidal shape with a recessed base and is surrounded by the first sub-pixel electrode 190a. The first sub-pixel electrode 190a has a pair of cutouts 91a and 91b which extend from the upper and lower edges to the right side with respect to FIG. 9.

In addition, one of the storage electrodes 137 is provided with one pair of the sub-pixel electrodes 190a and 190b, and extends from the storage electrode line 131 in upward and downward directions with an increasing area. A pair of drain electrodes 175a and 175b extending from upper and lower portions overlap the storage electrode 137.

The semiconductors 154 are formed as islands rather than lines and overlap the gate electrodes 121a and 121b. Other semiconductors 156 are formed at the intersections of the gate lines 121a and 121b and the storage electrode lines 131 and the data lines 171 and at the intersections of the drain electrodes 175a and 175b and the storage electrode 137. Therefore, the profile of surfaces at the intersections is smoothed, and the disconnection of the data lines 171 and the drain electrodes 175a and 175b can be prevented.

The cutouts 271 to 274b of the common electrode 270 include two central cutouts 271 and 272 which are located across the lower and upper half regions of the pixel electrode 190, cutouts 273a and 273b which are located in the upper region, and cutouts 273a and 273b which are located in the lower half region. Terms such as "lower" and "upper" are herein used in reference to FIG. 9.

The aforementioned features of the liquid crystal display panel assembly of FIGS. 4 to 8 may be applied to the liquid crystal display panel assembly of FIGS. 9 to 11.

Now, the display operations of the liquid crystal display will be described in detail.

The signal controller 600 receives input image signals R, G, and B and input control signals for controlling the display from an external graphics controller (not shown). The input image signals R, G and B contains luminance information (or image information) of each pixel PX, and the luminance has a predetermined number of grays, for example $1024(=2^{10})$, $256(=2^8)$ or $64(=2^6)$. As an example of the input control signals, a vertical synchronization signal Vsync, a horizontal synchronization signal Hsync, a main clock signal MCLK, and a data enable signal DE are received. The signal controller 600 processes the image signals R, G, and B according to an operating condition of the liquid display panel assembly 300 based on the input control signals and the input image signals R, G, and B to generate a gate control signal CONT1 and a data control signal CONT2. After that, the signal controller 600 transmits the generated gate control signal CONT1 to the gate driver 400 and the generated data control signal CONT2 and the processed image signal DAT to the data driver 500.

The gate control signal CONT1 includes a scanning start signal STV for indicating scanning starting and at least one clock signal for controlling an output time of the gate-on voltage Von. The gate control signal CONT1 may also include an output enable signal OE for defining a duration time of the gate-on voltage Von.

The data control signal CONT2 includes a horizontal synchronization start signal STH for indicating data transmission for a group of subpixels PXa or PXb, a load signal LOAD for commanding to apply data voltages to the data lines $D_1$ to $D_m$, and a data clock signal HCLK. The data control signal CONT2 may include a reverse signal RVS for inverting a polarity of the data voltage with respect to the common voltage Vcom (hereinafter, "the polarity of the data voltage with respect to the common voltage Vcom" being abbreviated to a "data signal polarity").

In response to the data control signal CONT2 from the signal controller 600, the data driver 500 receives the image data DAT for a group of the sub-pixels PX, selects one of the two gray voltage sets from the gray voltage generator 800, and selects a gray voltage corresponding to the image data DAT from the selected gray voltage set, so that the image data DAT is converted into the associated data voltage. After that, the data voltage is applied to the associated data lines $D_1$ to $D_m$.

Alternatively, instead of the data driver 500, an external selection circuit (not shown) that is separately provided may select one of the two gray voltage sets and transmit the selected one to the data driver 500. Otherwise, the gray voltage generator 800 may provide reference voltages having variable values, and the date driver 500 may divide the reference voltages, so that the gray voltages can be generated.

In response to the gate control signal CONT1 from the signal controller 600, the gate driver 400 applies the gate-on voltage Von to the gate lines $G_{1a}$ to $G_{nb}$ to turn on the switching devices Qa and Qb connected to the gate lines $G_{1a}$ to $G_{nb}$. As a result, the data voltages applied to the data lines $D_1$ to $D_m$ are applied to the associated sub-pixels PXa and PXb through the turned-on switching devices Qa and Qb.

The difference between the data voltage applied to the sub-pixels PXa and PXb and the common voltage Vcom becomes a charged voltage of the liquid crystal capacitors Clc, that is, a pixel voltage. Alignment of the liquid crystal molecules varies according to the intensity of the pixel voltage. Polarization of light passing through the liquid crystal layer 3 changes according to the alignment of the liquid crystal molecules. The change in the polarization results in a change in transmittance of the light due to the polarizers (not shown) attached to the display panels 100 and 200.

Figure 12:
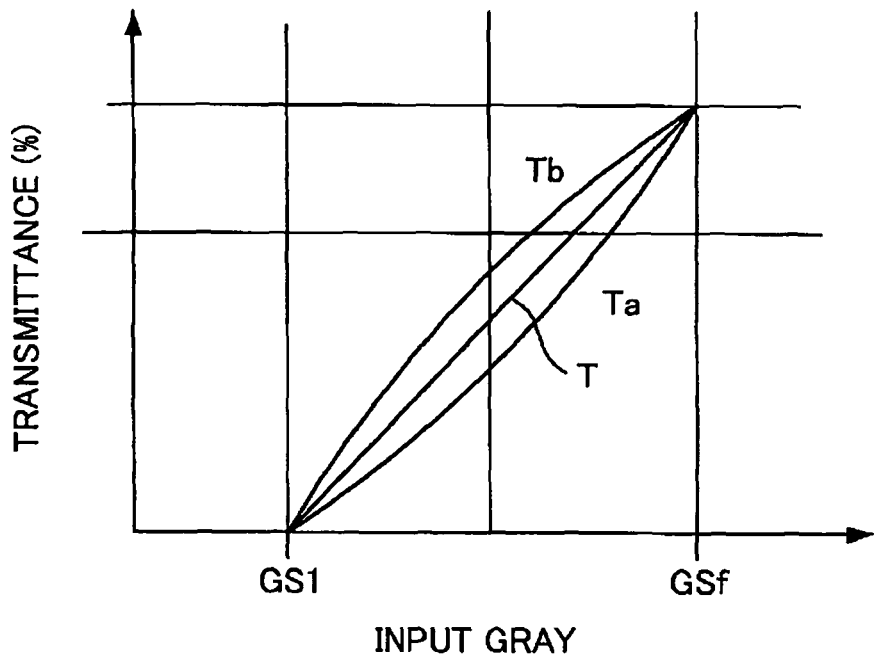
FIG. 12 is a graph showing a gamma curve of a liquid crystal display according to an embodiment of the present invention.

As shown in FIG. 12, the above-described two gray voltage sets represent different gamma curves Ta and Tb and are applied to the two sub-pixels PXa and PXb of one pixel PX, so that the gamma curve of the one PX is a composite curve T of the gamma curves. In the determination of the two gray voltage sets, the composite gamma curve T is determined to be close to a reference gamma curve for the front view. For example, the composite gamma curve T for the front view is determined to be equal to the reference gamma curve for the front view which is most suitable, and the composite gamma curve T for the side view is determined to be closest to the reference gamma curve for the front view. For example, if the gamma curve located at the lower view is formed to be lower in a low gray, it is possible to further improve lateral visibility.

In units of ½ a horizontal period (or ½ H) which is one period of the vertical synchronization signal Hsync and the gate clock signal CPV, the data driver 500 and the gate driver 400 repeatedly perform the aforementioned operations. In this manner, during one frame, the gate-on voltage Von is sequentially applied to all the gate lines $G_1$ to $G_{2n}$, so that the data voltages are applied to all the pixels. When one frame ends, the next frame starts, and a state of the reverse signal RVS applied to the data driver 500 is controlled so that the polarity of the data signal applied to each of the pixels is opposite to the polarity in the previous frame (frame inversion). At this time, even in one frame, according to the characteristics of the reverse signals RVS, the polarities of the data voltages flowing through the data lines may be inverted (row inversion and dot inversion), and the polarities of the data voltages simultaneously flowing through the data lines may be different form each other (column inversion and dot inversion).

Now, characteristics of the liquid crystal display according to an area ratio of two sub-pixel electrodes will be described with reference to FIGS. 13 and 14.

Figure 13:
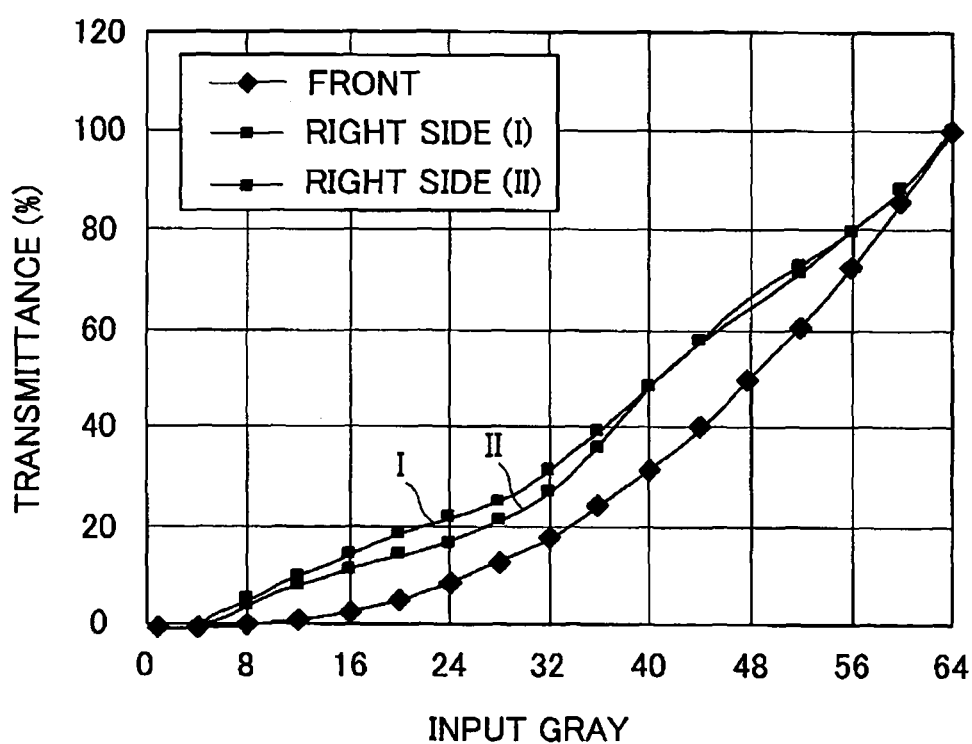
FIG. 13 is a graph showing a gamma curve of a liquid crystal display according to an embodiment of the present invention.
Figure 14:
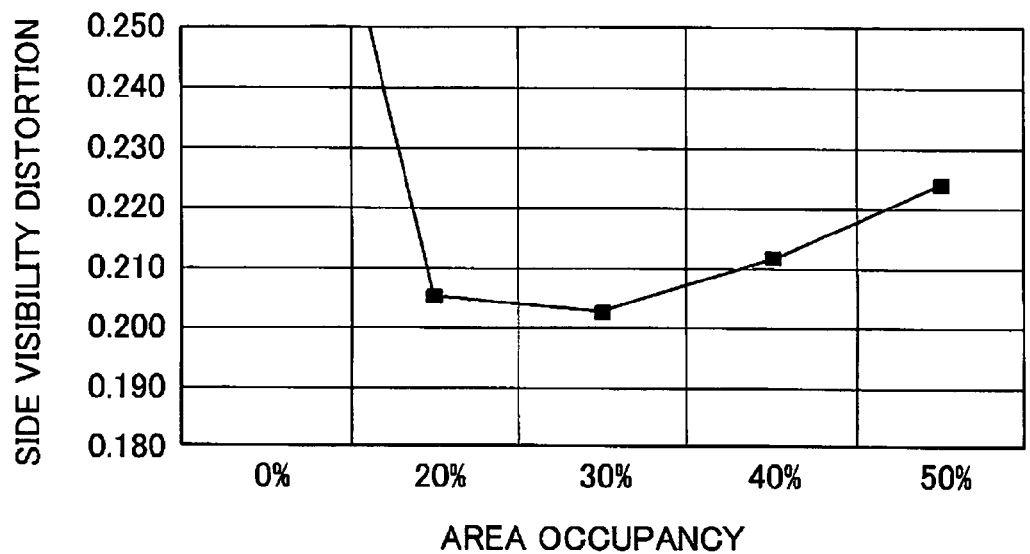
FIG. 14 is a graph showing visibility distortion with respect to an area ratio of two sub-pixel electrodes in a liquid crystal display according to an embodiment of the present invention.

FIG. 13 is a graph showing gamma curves of a liquid crystal display according to an embodiment of the present invention, and FIG. 14 is a graph showing visibility distortion with respect to the area ratio of two sub-pixel electrodes in the liquid crystal display according to the embodiment of the present invention.

As shown in FIG. 13, with respect to an area ratio of the second sub-pixel electrode 190b applied with a low voltage and the first sub-pixel electrode 190a applied with a high voltage, the right gamma curve for the area ratio of 2:1 (curve II) is closer to the front gamma curve than that the area ratio of 1:1 (curve I).

As shown in FIG. 14, as the area of the first sub-pixel electrode 190a supplied with the high voltage decreases below 50% of the total area of the pixel electrode 190, the visibility distortion decreases. When the area of the first sub-pixel electrode is equal to about 30% of the total area of the pixel electrode 190, the visibility distortion has a minimum value.

The liquid crystal display has twice the number of gate lines of a general liquid crystal display. Therefore, if the data voltages are applied according to a general applying method, the charging time is too short to obtain a desired voltage, especially due to the polarity inversion. To lengthen the charging time, the time periods for applying the gate-on voltage Von to two adjacent gate lines can partly overlap each other. The overlapping can be implemented by using the gate driver shown in FIGS. 1A and 1C.

Now, a method of applying the data voltages will be described in detail with reference to FIG. 15.

Figure 15:
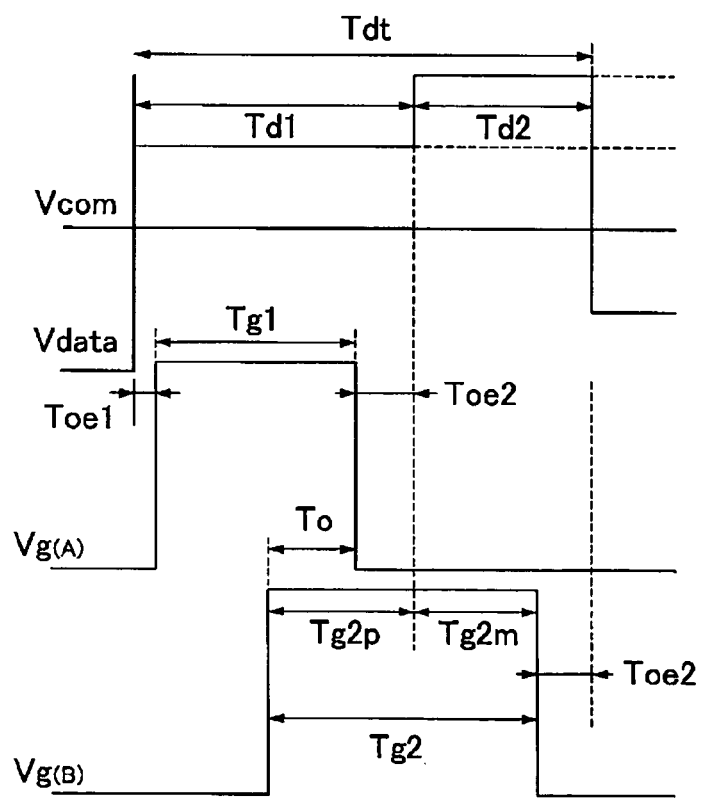
FIG. 15 is a waveform view of signals with respect to time in a liquid crystal display according to an embodiment of the present invention.

FIG. 15 is a waveform view of signals as function of time in the liquid crystal display according to the embodiment of the present invention. Here, Vg(A) denotes a gate signal applied to a first gate line, Vg(B) denotes a gate signal applied to a second gate line, and Vdata denotes data voltages flowing though a data line.

In the case of dot inversion, since the polarities of adjacent pixels are opposite of each other, the application of a data voltage for an adjacent pixel may not be suitable to reduce the charging time. Therefore, preferably, the charging periods for adjacent pixels do not overlap each other, and the charging periods for two sub-pixels of each pixel do overlap each other. By doing so, the charging time for the later-charged sub-pixel can be reduced. As shown in FIG. 15, it is preferable that the magnitude of the gray voltage set applied to the first-charged sub-pixel is higher than that of the gray voltage set applied to the later-charged sub-pixel.

As shown in FIG. 15, among a time period Tdt for applying data voltages Vdata to one pixel row, a time period Td1 for applying data voltages to the first sub-pixel electrodes 190a is longer than a time interval Td2 for applying data voltages to the second sub-pixel electrodes 190b. Since the voltages previously stored in the pixels have opposite polarity, such a sufficient charging time is required.

In addition, a time period Tg2 for applying the gate-on voltage to the second gate line 121b is designed to be longer than the time period Tg1 for applying the gate-on voltage to the first gate line 121a for obtaining a sufficient charging time.

In FIG. 15, a time period Toe2 from the end of the application of the gate-on voltage to the first gate line 121a to the end of the application of the data voltage Vdata to the first sub-pixel electrodes 190a and a time period Toe 2 from the end of the application of the gate-on voltage to the second gate line 121b to the end of the application of the data voltage Vdata to the second sub-pixel electrodes 190b are designed to be longer than a time period Toe1 from the start of the application of the data voltage Vdata to the start of the application of the gate-on voltage to the first gate line 121a. The long Toe2 may prevent the data voltage from being applied to the other sub-pixel or the next pixel row due to a delay of the data signal.

As shown in FIG. 9, the width of the first gate line 121a is not as wide as the second gate line 121b. The construction is allowable because a low voltage is applied to the first sub-pixel electrode 190a.

In this way, the voltages applied to the two pixel electrodes are accurately adjusted with desired levels, so that it is possible to improve visibility, to increase aperture ratio, and to improve transmittance.

Although the exemplary embodiments and the modified examples of the present invention have been described, the present invention is not limited to the embodiments and examples, but may be modified in various forms without departing from the scope of the appended claims, the detailed description, and the accompanying drawings of the present invention. Therefore, it is natural that such modifications belong to the scope of the present invention.

What is claimed is:

1. A liquid crystal display comprising:
    a pixel electrode comprising a first sub-pixel electrode and a second sub-pixel electrode;
    a first switching device connected to the first sub-pixel electrode;
    a second switching device connected to the second sub-pixel electrode;
    a plurality of gate lines including a first signal line and a second signal line, wherein the first signal line is connected to the first switching device and the second signal line is connected to the second switching device; and
    a data line intersecting the gate lines and transmitting data voltages, the data line connected to the first switching device and the second switching device,
    wherein a second voltage applied to the second sub-pixel electrode through the data line during a turn-on period of the second switching device is lower than a first voltage applied to the first sub-pixel electrode through the data line during a turn-on period of the first switching device,
    wherein the turn on period of the first switching device partially overlaps the turn on period of the second switching device,
    wherein a time duration of a gate-on voltage applied to the first signal line is longer than a time duration of a gate-on voltage applied to the second signal line, and
    wherein a time duration of the second voltage applied to the data line is longer than a time duration of the first voltage applied to the data line.

2. The liquid crystal display of claim 1,
    wherein voltages applied to the first and the second sub-pixel electrodes are different from each other and are obtained from single image information, and
    wherein the first sub-pixel electrode and the second sub-pixel electrode simultaneously start to be supplied with data voltages or the first sub-pixel electrode starts to be supplied with a data voltage after the second sub-pixel electrode starts to be supplied with a data voltage.

3. The liquid crystal display of claim 2, wherein the first sub-pixel electrode and the second sub-pixel electrodes are simultaneously supplied with the data voltages for a predetermined time period.

4. The liquid crystal display of claim 3, wherein a time period from an end of the application of the gate-on voltage to the second signal line to an end of the application of a data voltage to the second sub-pixel electrode and a time period from an end of the application of the gate-on voltage to the first signal line to an end of the application of the data voltage to the second sub-pixel electrode are longer than a time period from a start of the application of a data voltage to a start of the application of the gate-on voltage to the second signal line.

5. The liquid crystal display of claim 2, wherein the first sub-pixel electrode is surrounded by the second sub-pixel electrode.

6. The liquid crystal display of claim 2, wherein the second signal line overlaps the pixel electrode.

7. The liquid crystal display of claim 2, further comprising a storage electrode overlapping the pixel electrode.

8. The liquid crystal display of claim 7,
    wherein the first signal line is disposed at a boundary of the pixel electrode.

9. The liquid crystal display of claim 8, wherein the first signal line overlaps the pixel electrode.

10. The liquid crystal display of claim 9, wherein a width of the first signal line is less than a width of the second signal line.

11. The liquid crystal display of claim 1, wherein two data voltages having different voltage levels are applied during the turn on period of the first switching device.

12. The liquid crystal display of claim 11, wherein one voltage level of the two data voltages having different voltage levels has the same level as the data voltage applied during the second switching device turn on period.

13. A liquid crystal display comprising:
    a pixel comprising a first liquid crystal capacitor and a second liquid crystal capacitor and first and second switching elements,
    wherein the first liquid crystal capacitor comprises a first liquid crystal portion disposed between a common electrode and a first sub-pixel electrode, and the second liquid crystal capacitor comprises a second liquid crystal portion disposed between the common electrode and a second sub-pixel electrode,
    wherein the first switching element is connected to a data line and the first sub-pixel electrode, and the second switching element is connected to the data line and the second sub-pixel electrode, wherein the first switching element is connected to a first gate line and the data line, and the second switching element is connected to a second gate line and the data line,
    wherein a first sub-pixel voltage applied to the first liquid crystal portion through the data line during a turn-on period of the first switching element is larger than a second sub-pixel voltage applied to the second liquid crystal portion through the data line during a turn-on period of the second switching element,
    wherein the turn on period of the first switching element overlaps the turn on period of the second switching element,
    wherein the turn on period of the first switching element is longer than the turn on period of the second switching element, and
    wherein a time duration of the second sub-pixel voltage applied to the data line is longer than a time duration of the first sub-pixel voltage applied to the data line.

14. The liquid crystal display of claim 13, wherein the first sub-pixel voltage and the second sub-pixel voltage are originated based on same image information.

15. The liquid crystal display of claim 14, wherein the first switching element turns on simultaneously with or later than the second switching element.

16. The liquid crystal display of claim 15, wherein the first switching element turns on after a first time period from a start of application of a first data voltage to the data line and turns off before a second time period from an end of the application of the first data voltage and a start of application of a second data voltage to the data line,
    the second switching element turns on before the turning off of the first switching element and turns off before a third time period from an end of the application of the second data voltage,
    and each of the second time period and the third time period is longer than the first time period.

17. The liquid crystal display of claim 14, wherein the first sub-pixel electrode is surrounded by the second sub-pixel electrode.

18. The liquid crystal display of claim 14, wherein one of the first gate line and the second gate line overlaps at least one of the first sub-pixel electrode and the second sub-pixel electrode.

19. The liquid crystal display of claim 14, wherein the first switching element comprises a first electrode connected to the first sub-pixel electrode, the second switching element comprises a second electrode connected to the second sub-pixel electrode, and the liquid crystal display further comprises a storage electrode overlapping the first and the second electrodes.

20. The liquid crystal display of claim 14, wherein widths of the first gate line and the second gate line are different from each other.

21. The liquid crystal display of claim 13, wherein two data voltages having different voltage levels are applied during the turn on period of the first switching element.

22. The liquid crystal display of claim 21, wherein one voltage level of the two data voltages having different voltage levels is the same level as a data voltage applied during the second switching element turn on period.

* * * * *